(12) United States Patent  
Chung et al.

(10) Patent No.: US 7,944,043 B1
(45) Date of Patent: May 17, 2011

(54) SEMICONDUCTOR DEVICE HAVING IMPROVED CONTACT INTERFACE RELIABILITY AND METHOD THEREFOR

(75) Inventors: Young Suk Chung, Seoul (KR); Jae Yoon Kim, Seoul (KR); Tae Yong Lee, Gyeonggi-do (KR)

(73) Assignee: Amkor Technology, Inc., Chandler, AZ (US)

( * ) Notice: Subject to any disclaimer, the term of this patent is extended or adjusted under 35 U.S.C. 154(b) by 386 days.

(21) Appl. No.: 12/169,151

(22) Filed: Jul. 8, 2008

(51) Int. Cl.
*H01L 23/04* (2006.01)
(52) U.S. Cl. ...................... 257/698; 257/701
(58) Field of Classification Search ............. 257/787, 257/698, 706, 707, 701, 784, 778
See application file for complete search history.

(56) References Cited

U.S. PATENT DOCUMENTS

| | | | |
|---|---|---|---|
| 5,355,283 A * | 10/1994 | Marrs et al. | 361/760 |
| 5,900,676 A | 5/1999 | Kweon et al. | |
| 6,072,239 A * | 6/2000 | Yoneda et al. | 257/730 |
| 6,238,952 B1 | 5/2001 | Lin | |
| 6,329,711 B1 * | 12/2001 | Kawahara et al. | 257/698 |
| 6,342,730 B1 * | 1/2002 | Jung et al. | 257/692 |
| 6,365,980 B1 * | 4/2002 | Carter et al. | 257/787 |
| 6,376,921 B1 * | 4/2002 | Yoneda et al. | 257/787 |
| 6,495,909 B2 | 12/2002 | Jung et al. | |
| 6,498,099 B1 | 12/2002 | McLellan et al. | |
| 6,635,957 B2 | 10/2003 | Kwan et al. | |
| 6,777,265 B2 | 8/2004 | Islam et al. | |
| 6,812,552 B2 | 11/2004 | Islam et al. | |
| 7,049,177 B1 | 5/2006 | Fan et al. | |
| 2004/0164387 A1 | 8/2004 | Ikenaga et al. | |

FOREIGN PATENT DOCUMENTS

JP     11-017054     1/1999

* cited by examiner

*Primary Examiner* — S. V Clark
(74) *Attorney, Agent, or Firm* — Weiss & Moy, P.C.

(57) ABSTRACT

A semiconductor package has an insulative layer having at least one channel formed on a first surface thereof. A conductive pattern conforming to the at least one channel and exposed to a bottom surface of the semiconductor package is formed. A semiconductor die is electrically connected to the conductive patterns. An encapsulant is used to at least partially filling the at least one channel.

20 Claims, 18 Drawing Sheets

SEMICONDUCTOR DEVICE HAVING IMPROVED CONTACT INTERFACE RELIABILITY AND METHOD THEREFOR

FIELD OF THE INVENTION

This invention relates to semiconductor devices and, more specifically, to a semiconductor device wherein the length of the conductive wires is lessened to reduced the amount of noise generated.

BACKGROUND OF THE INVENTION

Presently, in the electronic industry, products that are made thin and small and that have high speed, multiple functions, high performance, and high reliability are required. One important technology that enables the products to be designed in this manner is semiconductor package technology called chip scale package (CSP).

In a bump chip carrier (BCC) semiconductor package that is one type of the CSP, only the part exposed to the outside to be attached to the pad metal and the board of a semiconductor die is bonded by electrically conductive wire. There are limitations on the length of the electrically conductive wire used during wire bonding in order to reduce a noise signal. Since only standoff stitch bonding (SSB) can be performed in a bump area in a wire bonding method, it takes a long time to perform the wire bonding process.

A thin substrate chip scale package (TSCSP) is another type of CSP. In a TSCSP certain wirebond routing cannot be performed due to limitations in board mounting. Thus, TSCSPs will have limitations on reducing the length of the electrically conductive wire.

Therefore, a need existed to provide a device and method to overcome the above problems.

SUMMARY OF THE INVENTION

A semiconductor package has an insulative layer having at least one channel formed on a first surface thereof. A conductive pattern conforming to the at least one channel and exposed to a bottom surface of the semiconductor package is formed. A semiconductor die is electrically connected to the conductive patterns. An encapsulant is used to at least partially filling the at least one channel.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1A:
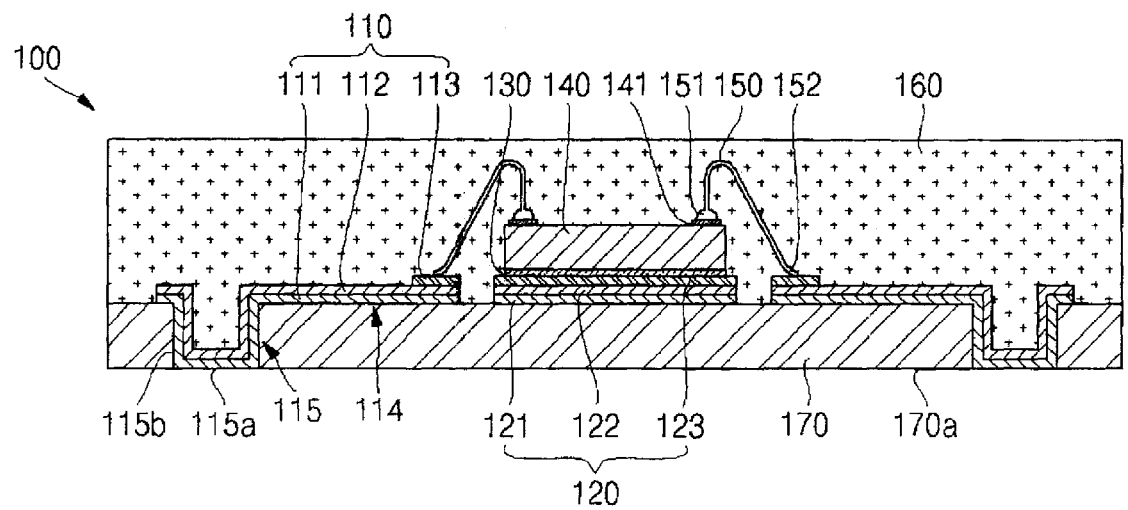
FIGS. 1A and 1B are a cross-sectional view and a perspective cross-sectional view illustrating a semiconductor package according to an embodiment of the present invention.
Figure 1B:
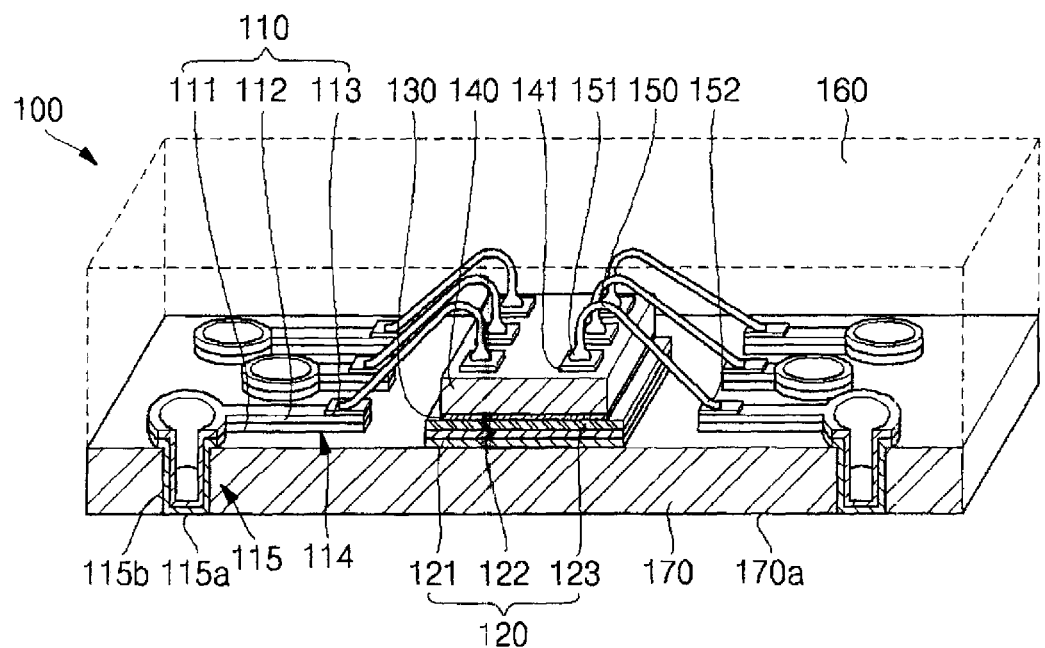

Referring to FIGS. 1A and 1B, a semiconductor package 100 according to an embodiment of the present invention is shown. The semiconductor package 100 may include electrically conductive patterns 110 formed of a plurality of metal layers, a set of metal pad layers 120 formed to run parallel with the electrically conductive patterns 110, an adhesive 130 formed on the metal pad layers 120, a semiconductor die 140 attached to the metal pad layers 120 by an adhesive 130, electrically conductive wires 150 for electrically coupling the electrically conductive patterns 110 and the semiconductor die 140, an encapsulant 160 for encapsulating the semiconductor die 140 and the electrically conductive wires 150, and an insulative layer 170 formed under the electrically conductive patterns 110 and the die pad layers 120.

As illustrated in FIGS. 1A and 1B, the electrically conductive patterns 110 are located adjacent to the semiconductor dies 140 with some distances. The electrically conductive pattern 110 can include a first metal layer 111, a second metal layer 112 formed on the first metal layer 111, and a third metal layer 113 selectively formed on portions of the second metal layer 112. The number of layers of the electrically conductive pattern 110 shown in FIGS. 1A and 1B are shown as an example. The electrically conductive pattern 110 can have different numbers of metal layers without departing from the spirit and scope of the present invention. The electrically conductive pattern 110 can be formed to have five or more layers.

The first metal layer 111 constitutes the lowest layer of the electrically conductive pattern 110. The first metal layer 111 enables solder to be easily wetted with a semiconductor package. The first metal layer 111 is formed of wettable material with solder. The first metal layer 111 may be formed of at least one of the following materials: Au, Sn, an alloy of Sn and Pb, Ni, Pd, or an equivalent material described. The listing of the above is given as an example and should not be seen as to limit the scope of the present invention. The first metal layer 111 is coupled to an external circuit by solder material to provide a signal input and output path for the semiconductor die 140.

The second metal layer 112 is formed to have the same shape as the electrically conductive pattern 110. The second metal layer 112 has the role of solder diffusion barrier. In the semiconductor package 100 according to one embodiment of the present invention, the electrically conductive patterns 110 are formed outside of the semiconductor die 140 toward the edge of the semiconductor package 100 for wiring. Therefore, the second metal layer 112 is formed to route wire lines. Although not shown in FIGS. 1A and 1B, the second metal layer 112 can include more than one metal layer.

The second metal layer 112 can be formed of Ni, Pd, Cu, or an equivalent of the above materials. However, the contents of the present invention are not limited to the above materials. The second metal layer 112 can be electrically coupled to the semiconductor die 140 by the electrically conductive wires 150.

Alternatively, a third metal layer 113 can be selectively formed on sections of the second metal layer 112. The third metal layer 113 enables the electrically conductive wires 150 to be easily coupled with the electrically conductive patterns 110. The third metal layer 113 can be formed of Au, Al, Ag, or an equivalent of the above materials. However, the contents of the present invention are not limited to the materials listed above.

The third metal layer 113 is electrically coupled to the semiconductor die 140 by the electrically conductive wires 150. The third metal layer 113 can be omitted if necessary. In this case, the electrically conductive wires 150 are coupled with the second metal layer 112. In addition, the area of the third metal layer 113 is not limited but can be formed in accordance with routing if necessary.

The electrically conductive pattern 110 can be divided into a first section 114 and a second section 115. The second section 115 conforms to a shape formed in an insulative layer 170. As shown in FIGS. 1A and 1B, the first section 114 is an approximately level section formed on the insulative layer 170. The first section 114 is generally formed on a horizontal surface of the insulative layer 170 and routed in the direction of an outer edge of the semiconductor package 100 with respect to the location of the semiconductor die 140.

The second section 115 is integrated with the first section 114 and conforms to a shape formed in an insulative layer 170. In the present embodiment, the second section 115 is integrated with the first section 114 in the form of a channel that penetrates the insulative layer 170. However, the channel is only given as an example. The shape formed in the insulative layer 170 may be any type of locking portion, reentrant portion, or formation in the insulative layer 170. If necessary, the inside of the second section 115 can be filled with metal. In this case, the channel or like structure (hereinafter channel) is replaced by a metal filled cylinder shape.

The second section 115 can include a bottom surface 115a and a curved side 115b formed on a vertical surface of the channel formed in the insulative layer 170. The bottom surface 115a is an exposed part of the electrically conductive patterns 110. The bottom surface 115a is exposed along a bottom surface of the semiconductor package 100. Although not shown, the shape of the bottom surface 115a can be circular, elliptical, oval, square, or the like. In addition, if necessary, the inside of the curved side 115b can be filled with metal. The curved side 115b is almost vertical to the bottom surface 115a to contact the insulative layer 170.

As illustrated in FIGS. 1A and 1B, the metal pad layers 120 contacts one side of the insulative layer 170, and located between the electrically conductive patterns 110. In addition, the metal pad layers 120 do not contact the electrically conductive patterns 110 of the semiconductor package 100, but are separated from the electrically conductive patterns 110. The metal pad layers 120 are formed on a plane that runs parallel with the electrically conductive patterns 110.

The metal pad layers 120 can include a first metal layer 121 that contacts the insulative layer 170, a second metal layer 122 formed on the first metal layer 121, and a third metal layer 123 formed on the second metal layer 122. The first metal layer 121, the second metal layer 122, and the third metal layer 123 of the metal pad layers 120 are formed on a plane that runs parallel with the first metal layer 111, the second metal layer 112, and the third metal layer 113 of the electrically conductive pattern 110. In addition, the first metal layer 121, the second metal layer 122, and the third metal layer 123 of the metal pad layers 120 have approximately the same thickness and material as the first metal layer 111, the second metal layer 112, and the third metal layer 113 respectively of the electrically conductive pattern 110. The third metal layer 123 of the metal pad layers 120 can be formed by the same process as the third metal layer 113 of the electrically conductive pattern 110. Therefore, the third metal layer 123 of the metal pad layers 120 may not be provided if necessary.

The metal pad layers 120 do not contact the electrically conductive patterns 110 but is insulated by the insulative layer 170. Thus, the metal pad layers 120 are electrically isolated. Therefore, although the first metal layer 121 and the second metal layer 122 are formed of metals, current cannot flow through the metal pad layers 120.

The adhesive 130 is formed on one side of the metal pad layers 120. In the embodiment shown in FIGS. 1A and 1B, the adhesive 130 is placed on the third metal layer 123 as a film or paste. If the third metal layer 123 is not provided, the adhesive 130 can be formed on the second metal layer 122 of the metal pad layers 120. The adhesive 130 adheres the semiconductor die 140 to the metal pad layers 120. The adhesive 130 can be formed of epoxy, adhesive tape, or an equivalent of the above materials. The semiconductor die 140 is adhered to the adhesive 130. That is, the semiconductor die 140 is attached to the metal pad layers 120 through the adhesive 130.

The semiconductor die 140 will have bond pads 141 on at least one surface thereof. The bond pad 141 is a metal electrode exposed to the outside so that a signal is input to or output from the semiconductor die 140. In FIG. 1A, the bond pad 141 protrudes out from the surface of the semiconductor die 140.

The electrically conductive wire 150 electrically couples the bond pad 141 of the semiconductor die 140 to the third metal layer 113 of the electrically conductive pattern 110. The third metal layer 113 of the electrically conductive pattern 110 can be omitted if necessary. In this case, the electrically conductive wire 150 electrically couples the bond pad 141 of the semiconductor die 140 with the second metal layer 112 of the electrically conductive pattern 110. The electrically conductive wire 150 can be formed of Al, Cu, Au, or equivalents thereof.

One end of the electrically conductive wire 150 is provided in the bond pad 141 of the semiconductor die 140 as a ball bonding portion 151 and the other end of the electrically conductive wire 150 is provided in the third metal layer 113 of the electrically conductive pattern 110 as a stitch bonding portion 152 using a capillary. That is, the electrically conductive wire 150 can be formed by a normal wire bonding method.

Alternatively, one end of the electrically conductive wire 150 can be coupled to the bond pad 141 as a stud bump and the other end of the electrically conductive wire 150 can be coupled to the third metal layer 113 of the electrically conductive pattern 110 as the ball bonding portion and can be coupled to the stud bump. That is, the electrically conductive wire 150 can be formed by a standoff stitch bonding (SSB) method. Therefore, both of the normal wire bonding method and the SSB method can be used as a method of forming the electrically conductive wire 150 of the semiconductor package 100 according to an embodiment of the present invention.

The encapsulant 160 encapsulates the semiconductor die 140, the electrically conductive wire 150, and exposed areas of the electrically conductive patterns 110 and the metal pad layers 120 on the surface of the insulative layer 170 where the semiconductor die 140 is attached. The encapsulant 160 maintains a uniform external shape to protect elements in the encapsulant 160 from the environments outside. The encapsulant 160 can be formed of epoxy resin, silicon resin, or an equivalent of the above materials.

The insulative layer 170 is formed under the electrically conductive pattern 110 and the metal pad layers 120. The insulative layer 170 fills the space under the flat part 114 of the electrically conductive pattern 110 and under the metal pad layer 120. Therefore, the bottom surface 115a of the electrically conductive pattern 110 and the bottom surface 170a of the insulative layer 170 can form the same plane exposed to the outside. The insulative layer 170 can be formed of epoxy molding compound (EMC), epoxy, polymer, polyimide (PI), benzo cyclo butene (BCB), poly benz oxazol (PBO), phenolic resin, or equivalents thereof. However, the contents of the present invention are not limited to the materials of the insulative layer 170.

The insulative layer 170 electrically insulates the semiconductor package 100 according to an embodiment of the present invention. Therefore, the electrically conductive pattern 110 formed through the insulative layer 170 is coupled to an external circuit, so an electrical signal can be input and output through the electrically conductive pattern 110. Whereas, the metal pad layers 120 formed on the insulative layer 170 can be electrically insulated.

In the semiconductor package 100, as described above, since the electrically conductive pattern 110 is horizontally extended and is integrally formed to the bottom surface 115a that contacts the outside, routing can be easily performed. In addition, the length of the electrically conductive wire 150 is reduced so that a large amount of a noise signal can be removed and that normal wire bonding can be performed. Therefore, manufacturing time can be reduced. In addition, the electrically conductive pattern 110 is formed with a step shape with height difference. An insulating material can be applied or molded between the step shape with height difference so that the insulative layer 170 can be easily formed.

Figure 2:
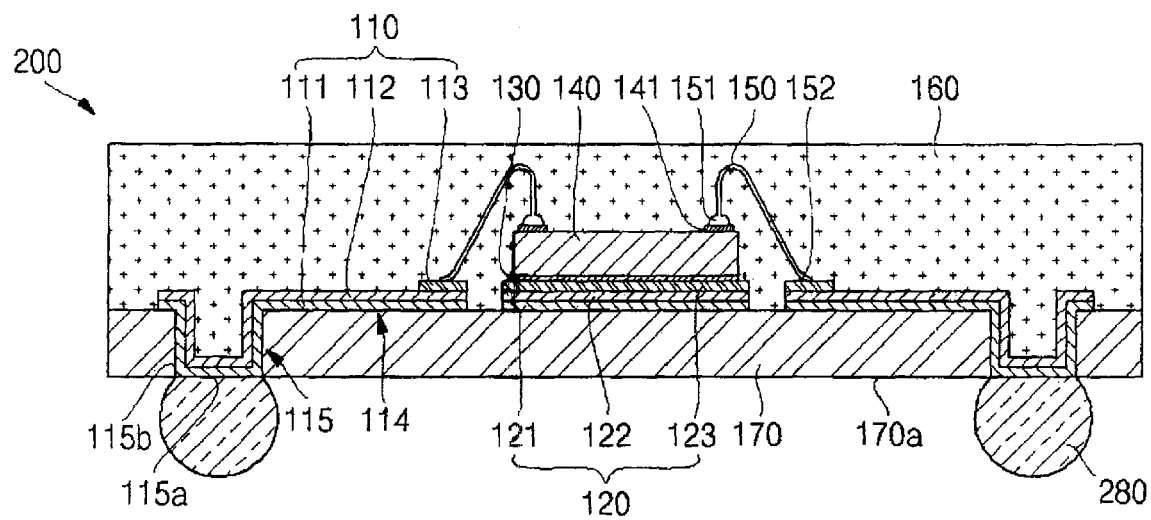
FIG. 2 is a cross-sectional view illustrating a semiconductor package according to another embodiment of the present invention.

Referring to FIG. 2, a sectional view of a semiconductor package 200 according to another embodiment of the present invention is illustrated. The semiconductor package 200 can include the electrically conductive pattern 110, the metal pad layers 120, the adhesive 130, the semiconductor die 140, the electrically conductive wire 150, the encapsulant 160, the insulative layer 170, and a solder ball 280 attached to the electrically conductive pattern 110.

The almost spherical solder ball 280 is attached to the bottom surface 115a of the electrically conductive pattern 110. The solder ball 280 undergoes a reflow process to be coupled to an external circuit so that an electrical signal is input to and output from the semiconductor die 140. The solder ball 280 can be alloy of Sn, Pb, Ag, or Cu. However, the contents of the present invention are not limited to the above materials of the solder ball 280.

As described above, in the semiconductor package 200 routing can be easily performed, normal wire bonding can be performed, and the length of the electrically conductive wire can be reduced. The semiconductor package 200 includes a ball grid array (BGA). Therefore, the semiconductor package 200 can be electrically coupled to an external circuit by a reflow process that is simpler than a process of additionally applying solder.

Figure 3:
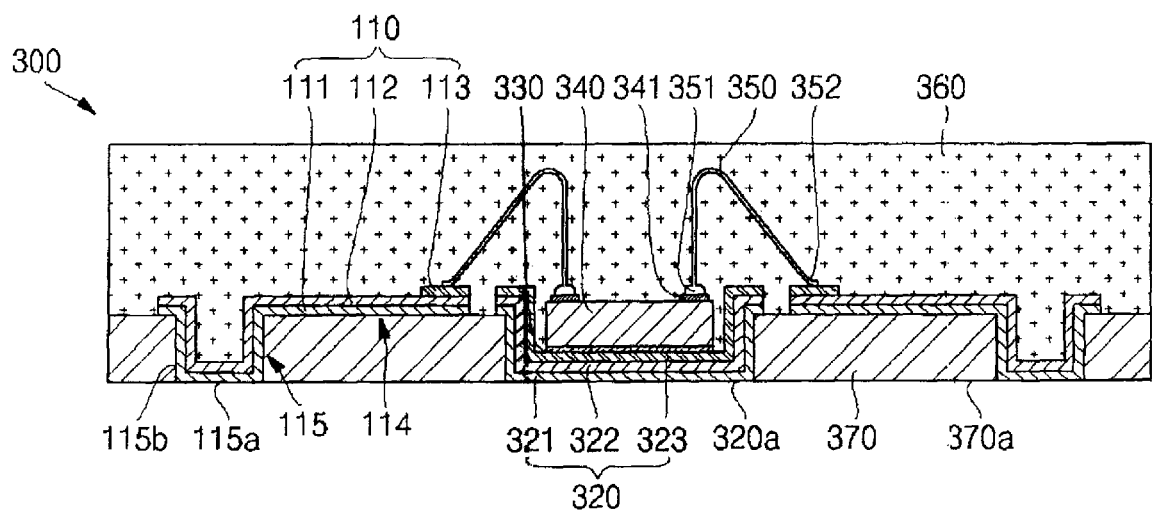
FIG. 3 is a cross-sectional view illustrating a semiconductor package according to still another embodiment of the present invention.

FIG. 3 is a cross-sectional view illustrating a semiconductor package 300 according to still another embodiment of the present invention. The semiconductor package 300 can include the electrically conductive pattern 110, metal pad layers 320, an adhesive 330 formed on the metal pad layers 320, a semiconductor die 340 adhered to the adhesive 330, an electrically conductive wire 350 for electrical coupling the electrically conductive pattern 110 and the semiconductor die 340 to each other, an encapsulant 360 for encapsulating the semiconductor die 340 and the electrically conductive wire 350, and an insulative layer 370 formed in the space provided by the electrically conductive pattern 110 and the metal pad layers 320.

The metal pad layers 320 is formed is the insulative layer 370 and is in the form of a well having a space therein. In addition, the bottom surface 320a of the metal pad layers 320 can form the same plane as the bottom surface 370a of the insulative layer 370. That is, the metal pad layers 320 are in the form of a well that passes through the inside of the insulative layer 370. Therefore, the first metal layer 321, the second metal layer 322, and the third metal layer 323 that constitute the metal pad layers 320 are also in the form of wells. At this time, since the third metal layer 323 is formed by the same process as the third metal layer 113 of the electrically conductive pattern 110, the third metal layer 323 may not be formed if necessary.

In addition, if necessary, the inside of the well formed by the metal pad layers 320 can be filled. In this case, the metal pad layers 320 would be in the form of a column instead of a well.

The metal pad layers 320 are the same as the metal pad layers 120 of the semiconductor package 100 excluding the shape.

The adhesive 330 is formed in the well formed by the metal pad layers 320. The adhesive 330 is the same as the adhesive 130 of the semiconductor package 100 according to an embodiment of the present invention excluding the position in which the adhesive 330 is formed.

The semiconductor die 340 is adhered to the adhesive 330. That is, the semiconductor die 340 is attached to the metal pad layers 320 through the adhesive 330. In addition, the semiconductor die 340 is put into the well shape formed by the metal pad layers 320.

Since the semiconductor die 340 is put into the well-shaped formed by the metal pad layers 320, the height of the bond pad 341 of the semiconductor die 340 can be formed so that a step difference between the height of the bond pad 341 and the height of the electrically conductive pattern 110 is small. In addition, the well-shaped formed by the metal pad layers 320 allows one side of the semiconductor die 340 to be closer to the outside via the metal pad layers 320, thus dissipation of heat can be easily done. The semiconductor die 340 is the same as the semiconductor die 140 of the semiconductor package 100 according to an embodiment of the present invention excluding the position in which the semiconductor die 340 is located.

The electrically conductive wire 350 electrically couples the electrically conductive pattern 110 and the bond pad 341 of the semiconductor die 340 to each other. As described in the semiconductor package 100 according to an embodiment of the present invention, the third metal layer 113 of the electrically conductive pattern 110 can be omitted if necessary. Therefore, the electrically conductive wire 350 couples the third metal layer 113 and the bond pad 341 to each other or couples the second metal layer 112 and the bond pad 341 to each other.

Since the semiconductor die 340 is formed in the well-shaped formed by the metal pad layers 320, there is no remarkable step difference between the height of the electrically conductive pattern 110 and the height of the bond pad 341. Therefore, since the length of the electrically conductive wire 350 for coupling the electrically conductive pattern 110 and the bond pad 341 to each other can be reduced, a noise signal can be reduced. In addition, since the loop height of the electrically conductive wire 350 can be reduced, the thickness of the semiconductor package 300 can be reduced.

The electrically conductive wire 350 is the same as the electrically conductive wire 150 of the semiconductor package 100 according to an embodiment of the present invention excluding that the length and the loop height of the electrically conductive wire 350 can be reduced.

The encapsulant 360 encapsulates the semiconductor die 340, the electrically conductive wire 350, and exposed areas of the electrically conductive patterns 110 and the metal pad layers 320 on the surface of the insulative layer 370 where the semiconductor die 340 is attached. The encapsulant 360 is the same as the encapsulant 160 of the semiconductor package 100 according to an embodiment of the present invention excluding that the encapsulant 360 fills more in the space between the metal pad layers 320 and the semiconductor die 340.

The insulative layer 370 is formed in the space provided by the electrically conductive pattern 110 and the metal pad layers 320. The insulative layer 370 is formed so that the bottom surface 370a of the insulative layer 370 runs parallel with the bottom surface 115a of the electrically conductive pattern 110 and the bottom surface 320a of the metal pad layers 320. The insulative layer 370 is the same as the insulative layer 170 of the semiconductor package 100 according to an embodiment of the present invention except that the volume of the space is different because of the shape of the metal pad layers 320 varies.

As described above, the semiconductor package 300 can have routed traces to reduce the length of the electrically conductive wire 350 so the noise of signals can be reduced. Also, by enabling the normal wire bonding, process time can be reduced. In addition, by reducing the height of the entire semiconductor package 300, the semiconductor package 300 can be miniaturized. The semiconductor package 300 also allows for heat from the semiconductor die 340 to be easily dissipated.

Figure 4:
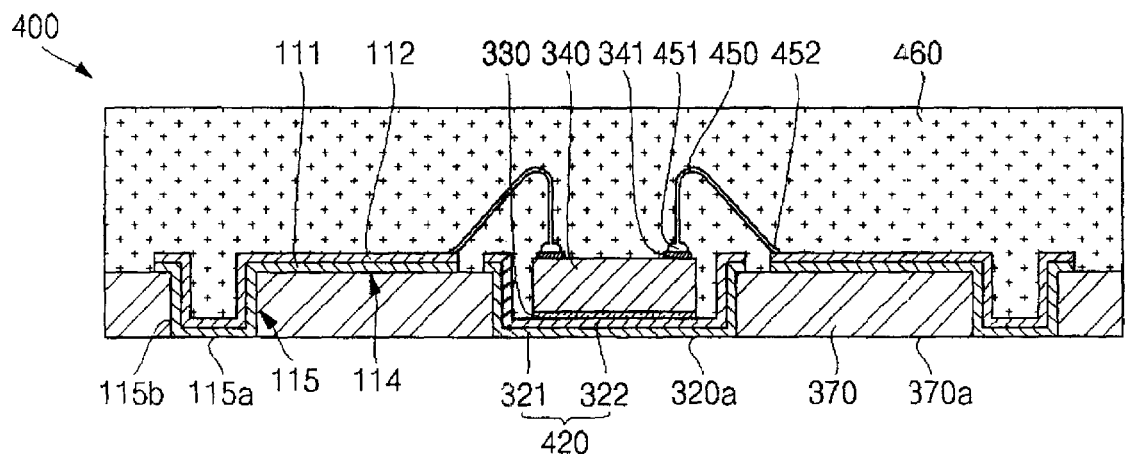
FIG. 4 is a cross-sectional view illustrating a semiconductor package according to still another embodiment of the present invention.

FIG. 4 is a cross-sectional view illustrating a semiconductor package 400 according to still another embodiment of the present invention. The semiconductor package 400 can include a first metal layer 111 and a second metal layer 112, metal pad layers 420, an adhesive 330, a semiconductor die 340, an electrically conductive wire 450, an encapsulant 460, and an insulative layer 370.

The metal pad layers 420 can include a first metal layer 321 and a second metal layer 322. The metal pad layers 420 is different from the metal pad layers 320 of the semiconductor package 300 in that the metal pad layers 420 do not include a third metal layer 322. Since the metal pad layers 420 are the same as the metal pad layers 320 according to the previous embodiment excluding the third metal layer 322, description thereof will be omitted.

The electrically conductive wire enables the metal pad layers 420 formed on the lower surface of the semiconductor die 340 to be used as another electrode. For example, a ground electrode can be coupled to the metal pad layers 420. The electrically conductive wire 450 is the same as the electrically conductive wire 350 of the semiconductor package 300 according to still another embodiment of the present invention excluding that the metal pad layer 420 and the semiconductor die 340 are electrically coupled to each other.

The encapsulant 460 is used to encapsulate the semiconductor package 400. The encapsulant 460 is the same as the encapsulant 360 of the semiconductor package 300.

As described above, in the semiconductor package 400 routing can be performed, the length of the electrically conductive wire is reduced, normal wire bonding can be performed, the semiconductor package is miniaturized, and the semiconductor die can easily dissipate the heat. In addition, the metal pad layers 420 can be used as another electrode.

Figure 5:
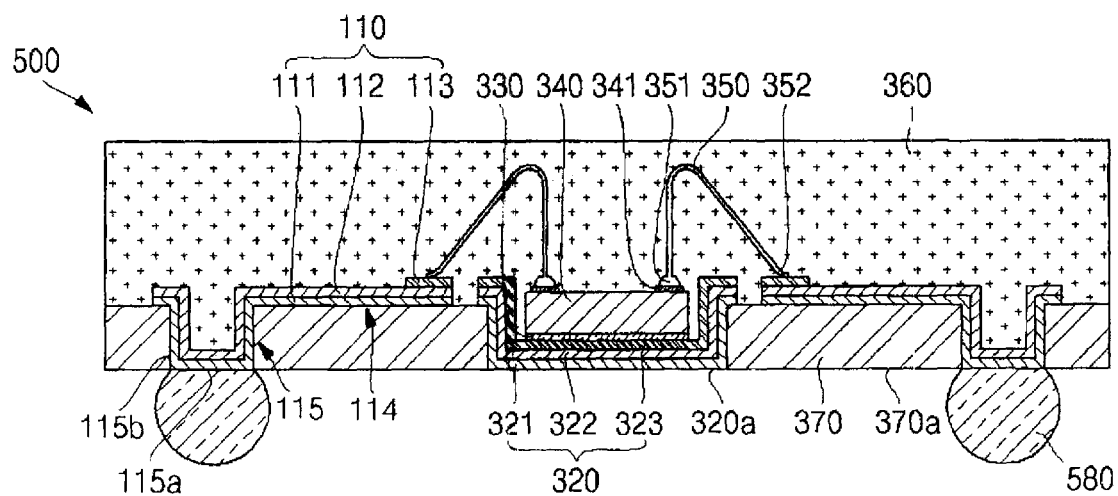
FIG. 5 is a cross-sectional view illustrating a semiconductor package according to still another embodiment of the present invention.

FIG. 5 is a cross-sectional view of a semiconductor package 500 according to still another embodiment of the present invention. The semiconductor package 500 can include an electrically conductive pattern 110, metal pad layers 320, an adhesive 330, a semiconductor die 340, an electrically conductive wire 350, an encapsulant 360, an insulative layer 370, and a solder ball 580.

The solder ball 580 is formed on the bottom surface 115a of the electrically conductive pattern 110 in the form of a sphere. The solder ball 580 is coupled to an external circuit through a reflow process so that an electrical signal can be inputted and outputted. The solder ball 580 is the same as the solder ball 280 of the semiconductor package 200 according to another embodiment of the present invention.

As described above, in a semiconductor package 500, routing can be performed, the length of the electrically conductive wire is reduced, normal wire bonding can be performed so that process time can be reduced, the semiconductor package is miniaturized, and the semiconductor die can easily dissipate heat. In addition, since the semiconductor package 500 includes a ball grid array (BGA), the semiconductor package 500 can be electrically coupled to an external circuit only by a simple reflow process without a process of applying solder.

Figure 6:
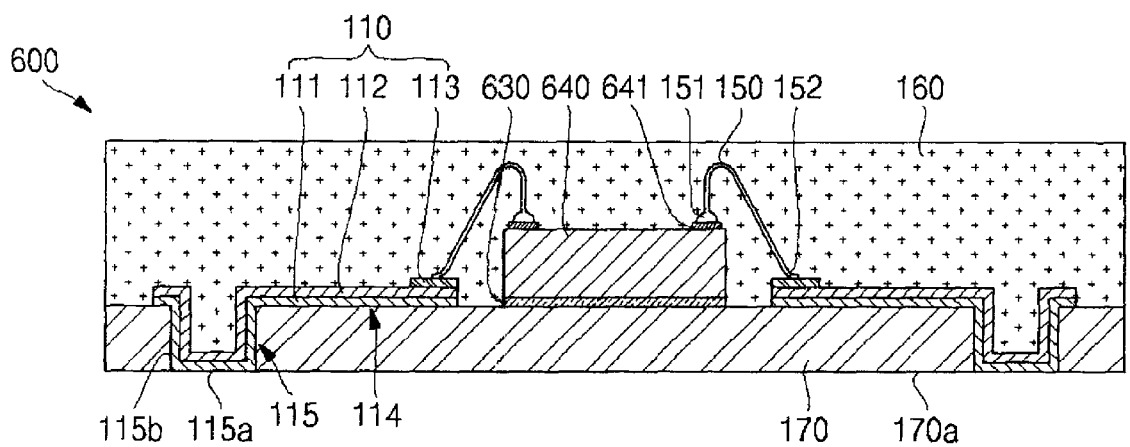
FIG. 6 is a cross-sectional view illustrating a semiconductor package according to still another embodiment of the present invention.

FIG. 6 is a cross-sectional view of a semiconductor package 600 according to still another embodiment of the present invention. The semiconductor package 600 includes the electrically conductive patterns 110, an adhesive 630, a semiconductor die 640, the electrically conductive wires 150, the encapsulant 160, and the insulative layer 170.

Referring to FIGS. 1 and 6, the adhesive 630 is formed on the insulative layer 170. Unlike the semiconductor package 100, the semiconductor package 600 does not include the metal pad layers 120. Therefore, the adhesive 630 is directly formed on the insulative layer 170.

The semiconductor die 640 is placed on the adhesive 630. The semiconductor die 640 is the same as the semiconductor die 140 of the semiconductor package 100 excluding the metal pad layers 120 are not formed under the semiconductor die 640. In addition, a bond pad 641 is formed on one surface of the semiconductor die 640. The bond pad 641 is the same as the bond pad 141 of the semiconductor package 100 excluding that the bond pad 641 is formed on one surface of the semiconductor die 640.

The semiconductor package 600 does not include the lower layer of die unlike in the previous embodiments. That is, the adhesive 630 and the semiconductor die 640 are directly provided on the insulative layer 170. Therefore, since the entire height of the semiconductor package 600 can be reduced, the semiconductor package 600 can be miniaturized and the material of the lower layer of die can be reduced.

Hereinafter, a method of manufacturing the semiconductor package 100 according to an embodiment of the present invention will be described. FIGS. 7A to 7L are sectional views illustrating a method of manufacturing the semiconductor package 100 according to an embodiment of the present invention.

Figure 7A:
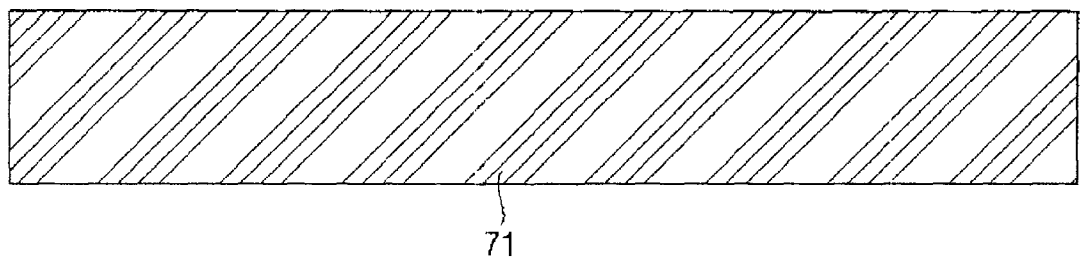
FIGS. 7A to 7L are sectional views illustrating a method of manufacturing a semiconductor package according to an embodiment of the present invention.

As illustrated in FIG. 7A, a metal carrier 71 is first provided. The thickness of the metal carrier 71 is thicker than the electrically conductive pattern 110 of the semiconductor package 100 according to an embodiment of the present invention. The metal carrier 71 undergoes an etching process to be described later. Therefore, the metal carrier 71 is formed of a material that is easily etched. In accordance with one embodiment, the metal carrier 71 can be formed of Cu, a Cu alloy, or an equivalent of the above materials. The contents of the present invention are not limited to the above materials.

Figure 7B:
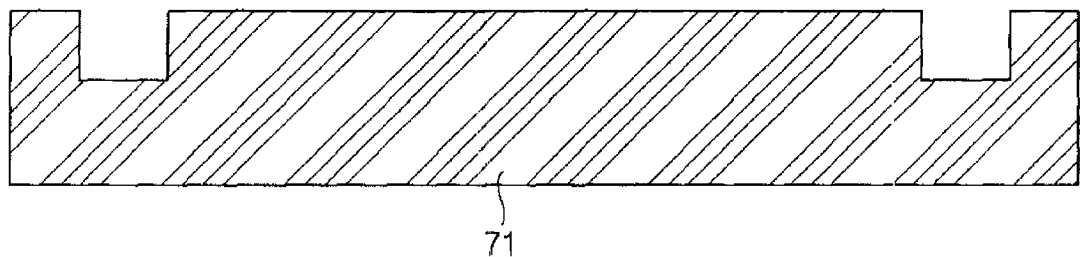

As illustrated in FIG. 7B, a pattern is formed in the metal carrier 71. The pattern is formed in the region where the first metal layer 111 and the second metal layer 112 of the electrically conductive pattern 110 are to be formed. A method of forming the pattern can be etching. The contents of the present invention are not limited to the above method.

Figure 7C:
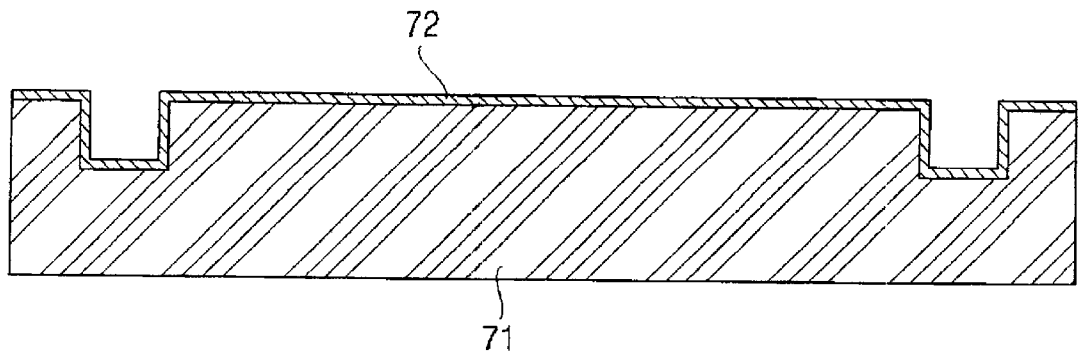
Figure 7D:
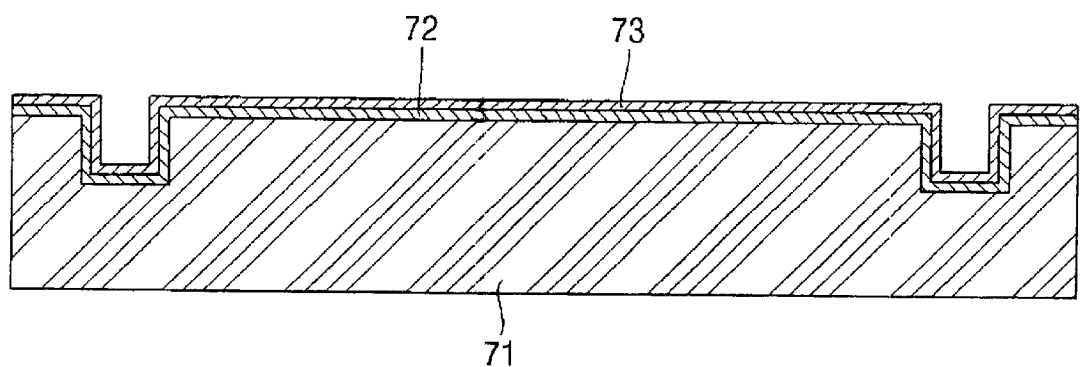

As illustrated in FIGS. 7C and 7D, a lower metal layer 72 is formed in a metal carrier 71 where the pattern is formed. Then, an upper metal layer 73 is formed in the lower metal layer 72. The lower metal layer 72 becomes the first metal layer 111 of the electrically conductive pattern 110 and the first metal layer 121 of the metal pad layers 120 through the pattern. The lower metal layer 72 can be formed of solder, Au, Sn, Sn/Pb, Ni, Pd that are wettable materials, or an equivalent of the above materials. The upper metal layer 73 becomes the second metal layer 112 of the electrically conductive pattern 110 and the second metal layer 122 of the metal pad layers 120 through the pattern. The upper metal layer 73 can be formed of Ni, Pd, Cu, or an equivalent of the above materials. A method of forming the lower metal layer 72 and the upper metal layer 73 can be an electrolytic plating method or an electroless plating method. However, the contents of the present invention are not limited to the above methods.

Figure 7E:
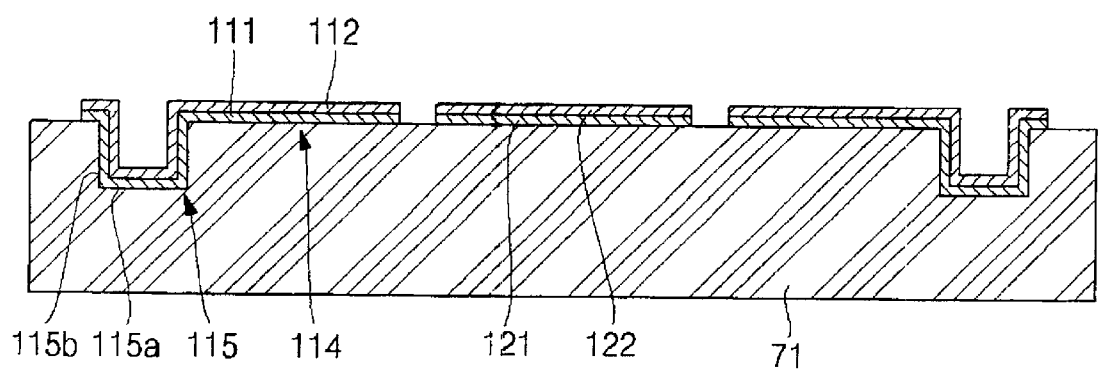

As illustrated in FIG. 7E, a process of forming the pattern of the lower metal layer 72 and the upper metal layer 73 is performed. The pattern makes the first metal layer 111 and the second metal layer 112 of the electrically conductive pattern separated from the first metal layer 121 and the second metal layer 122 of the metal pad layers 120. In order to form the pattern, a photolithography process can be used. However, the contents of the present invention are not limited to the method of forming the pattern.

Figure 7F:
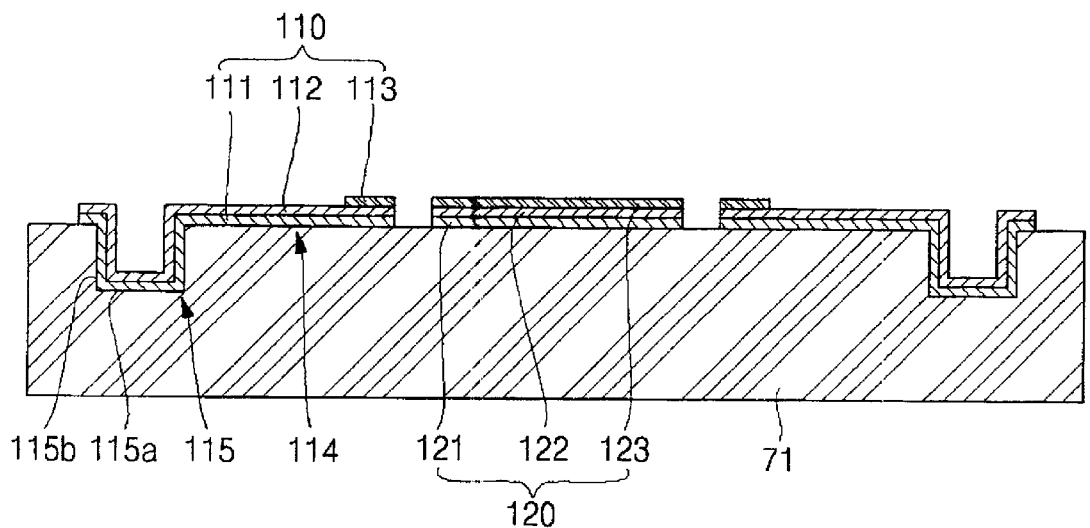

As illustrated in FIG. 7F, a process of forming the third metal layer 113 of the electrically conductive pattern 110 and the third metal layer 123 of the metal pad layers 120 can be performed. A metal layer is entirely applied and then, is patterned through photography to form the metal layers 113 and 123. In addition, a pattern is defined by photoresist and then, electrolytic or electroless plating is performed to form the metal layers 113 and 123. The metal layers 113 and 123 can be formed of Au, Al, or an equivalent of the above materials. However, the contents of the present invention are not limited to the method of forming the metal layers 113 and the materials of the metal layers 113. In addition, as described above, the third metal layer 113 of the electrically conductive pattern 110 can be selectively formed if necessary and can be formed along routing. The third metal layer 123 of the metal pad layers 120 can be selectively formed. As a result, the present process can be selectively performed if necessary.

Figure 7G:
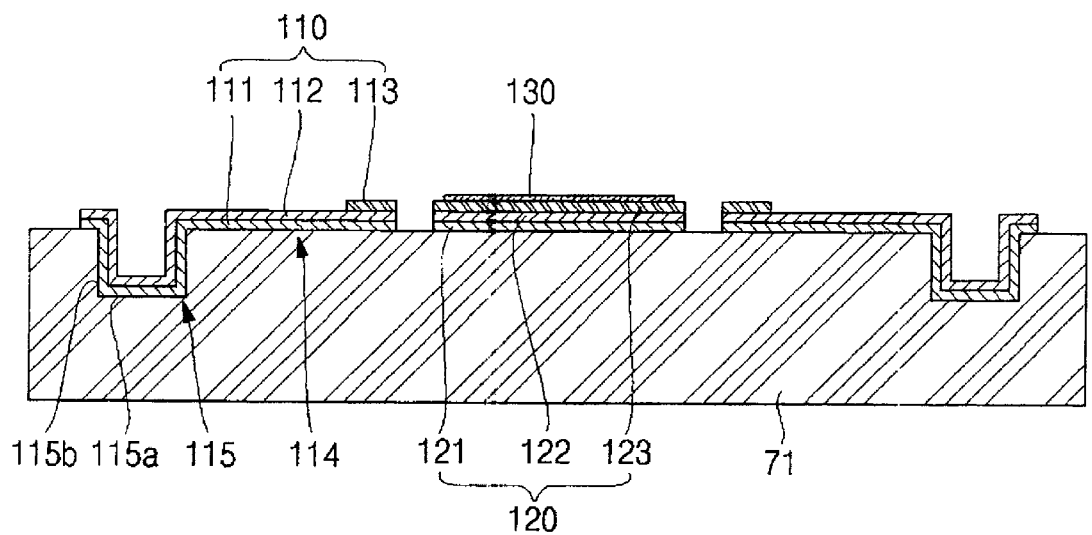

As illustrated in FIG. 7G, the adhesive 130 is formed on one surface of the metal pad layers 120. As shown in FIG. 7G, the adhesive 130 is formed on the third metal layer 123. The adhesive 130 can be formed of epoxy, adhesive tape, or an equivalent of the above materials. However, the contents of the present invention are not limited to the above materials.

Figure 7H:
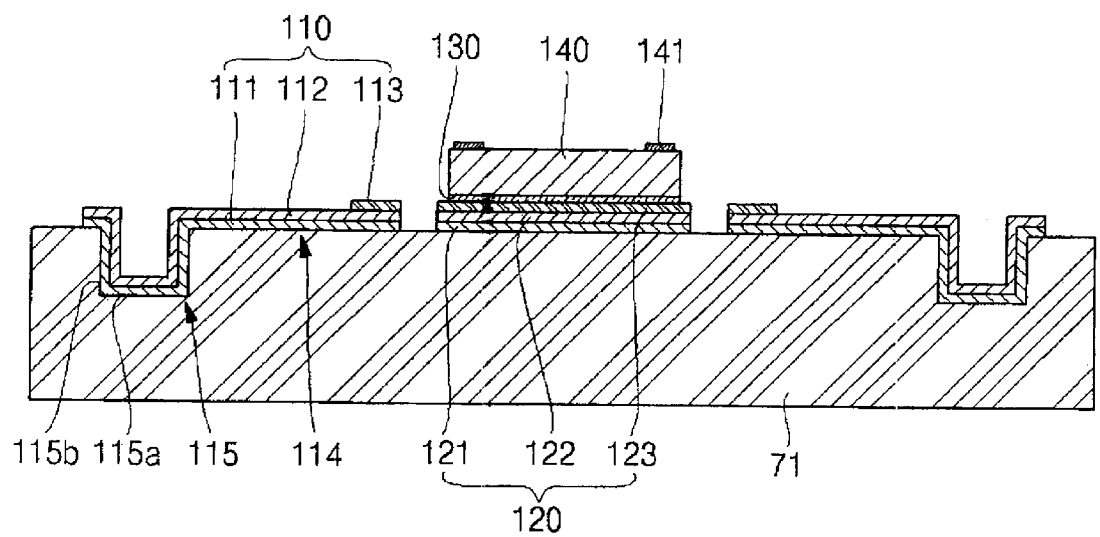

As illustrated in FIG. 7H, the semiconductor die 140 is adhered to the adhesive 130 to be attached to the metal pad layers 120. In addition, although not shown in the drawing, a cure process is additionally performed in order to cure the adhesive 130. Therefore, the semiconductor die 140 can be fixed in a state of being attached to the metal pad layers 120.

Figure 7I:
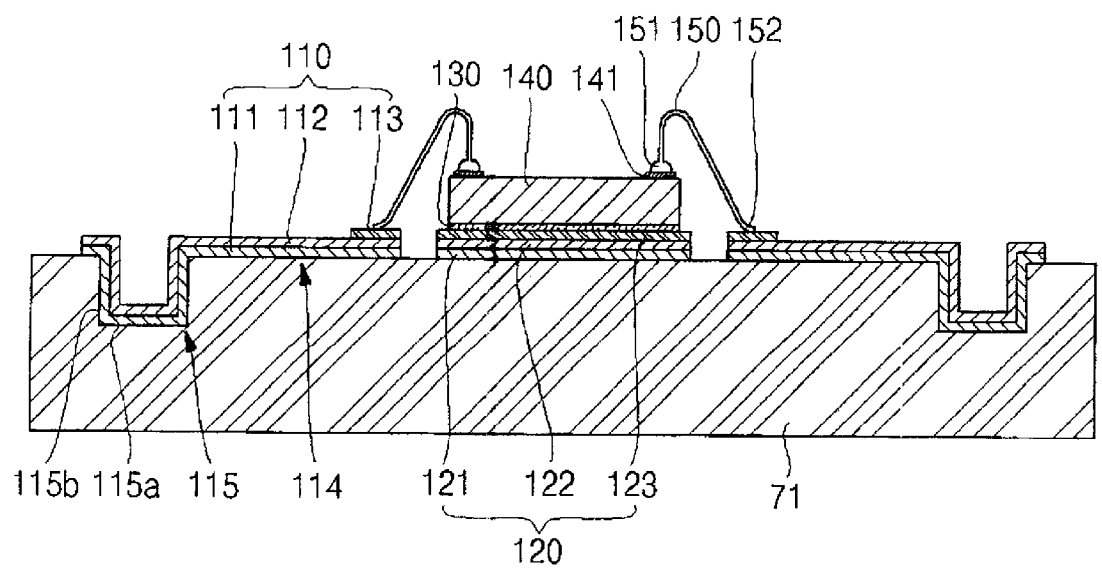

As illustrated in FIG. 7I, wire bonding is performed. The electrically conductive wire 150 electrically couples the third metal layer 113 of the electrically conductive pattern 110 to the bond pad 141 of the semiconductor die 140. When the third metal layer 113 of the electrically conductive pattern 110 is not provided, the electrically conductive wire 150 electrically couples the second metal layer 112 of the electrically conductive pattern 110 to the bond pad 141 of the semiconductor die 140.

In addition, one end of the electrically conductive wire 150 is provided in the bond pad 141 of the semiconductor die 140 as a ball bonding portion 151 and the other end of the electrically conductive wire 150 is provided in the third metal layer 113 of the electrically conductive pattern 110 as a stitch bonding portion 152 using a capillary. That is, the electrically conductive wire 150 can be formed by a normal wire bonding method.

Alternatively, one end of the electrically conductive wire 150 is provided in the bond pad 141 as a stud bump and the other end of the electrically conductive wire 150 is provided in the third metal layer 113 of the electrically conductive pattern 110 as the ball bonding portion and can be coupled to the stud bump. That is, the electrically conductive wire 150 can be formed by a standoff stitch bonding (SSB) method. However, the contents of the present invention are not limited to the electrically conductive wire bonding method.

Figure 7J:
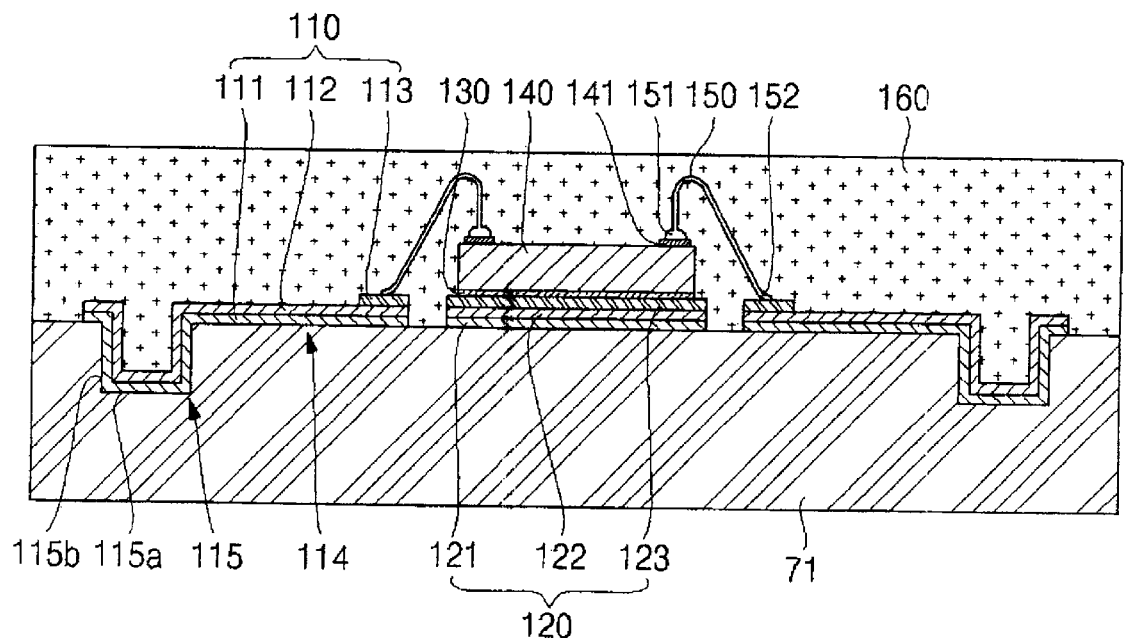

As illustrated in FIG. 7J, encapsulation is performed. The encapsulant 160 encapsulates the semiconductor die 140, the electrically conductive wire 150, and exposed areas of the electrically conductive patterns 110 and the metal pad layers 120 on the surface of the insulative layer 170 where the semiconductor die 140 is attached. The encapsulant 160 can be formed of epoxy resin, silicon resin, or an equivalent of the above materials. However, according to the present invention, the materials of the encapsulant 160 are not limited to the above materials. In addition, although not shown, the encapsulant 160 covers the semiconductor die 140 and the electrically conductive wire 150 with liquid form, and then, is solidified later.

Figure 7K:
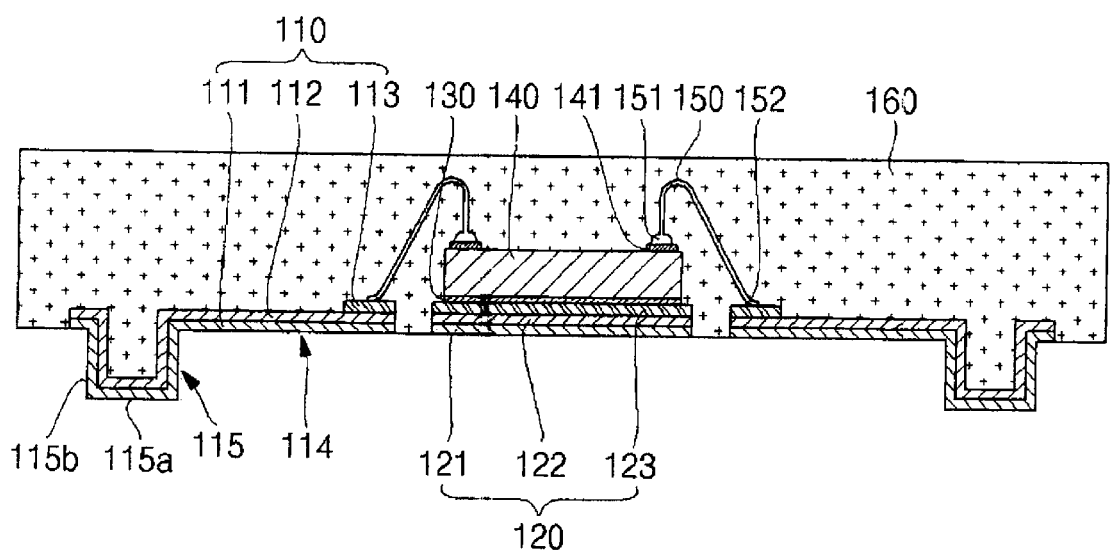

As illustrated in FIG. 7K, a process of removing the metal carrier 71 is performed. The metal carrier 71 can be removed through etching. However, the contents of the present invention are not limited by the etching method.

Figure 7L:
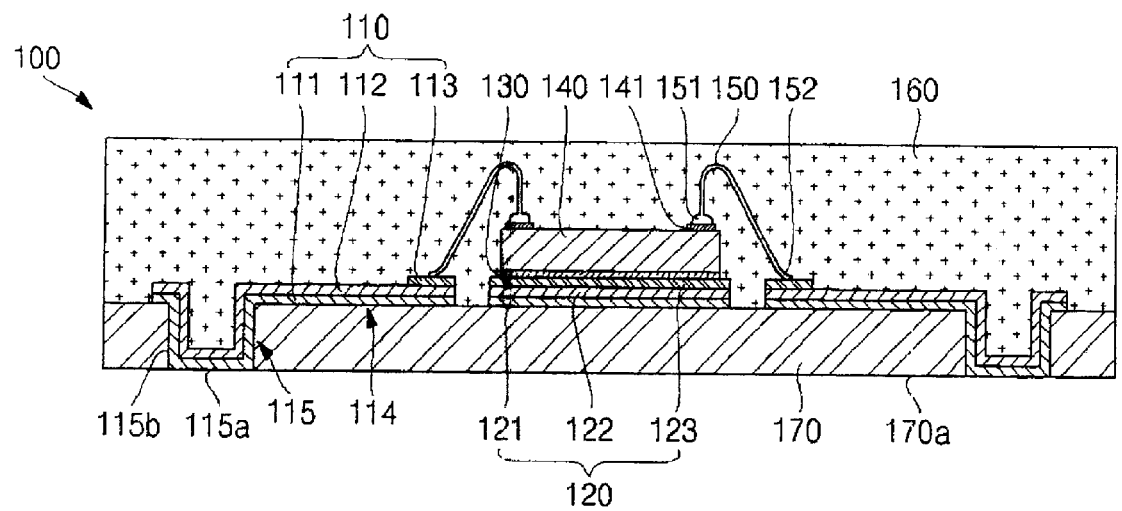

As illustrated in FIG. 7L, a step of forming the insulative layer 170 is performed. The insulative layer 170 is formed by filling the lower space formed by the planarizing unit 114 of the electrically conductive pattern 110, the metal pad layers 120, and the encapsulant 160. The insulative layer 170 can be formed of epoxy molding compound (EMC), epoxy, polymer, polyimide (PI), benzo cyclo butene (BCB), poly benz oxazol (PBO), phenolic resin, or an equivalent of the above materials as described above. However, the contents of the present invention are not limited to the materials of the insulative layer 170. The insulative layer 170 can be formed by a molding method, a printing method, or a spraying method. In addition, although not shown in the drawing, a buffing process can be additionally performed in order to planarize the surface of the insulative layer 170. In addition, if necessary, electroless Au plating can be performed on the bottom surface 115a of the electrically conductive pattern 110 or an organic solderability preservative (OSP) process can be performed after the buffing process.

By doing the above, the semiconductor package 100 can be manufactured. Moreover, in the semiconductor package 100, as described above, routing is enabled, processing time can be reduced by doing the normal wire bonding, and the noise signal can be reduced by decreasing the length of the electrically conductive wire.

Figure 8A:
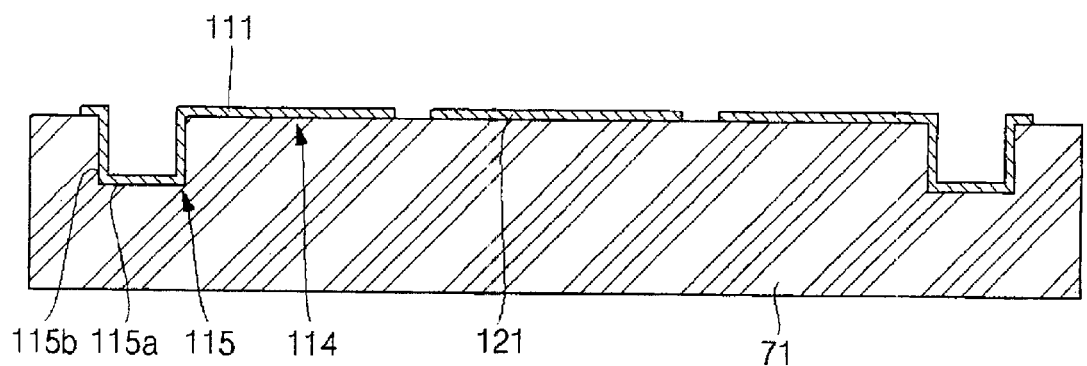
FIGS. 8A and 8B are sectional views illustrating another method of manufacturing a semiconductor package according to an embodiment of the present invention.
Figure 8B:
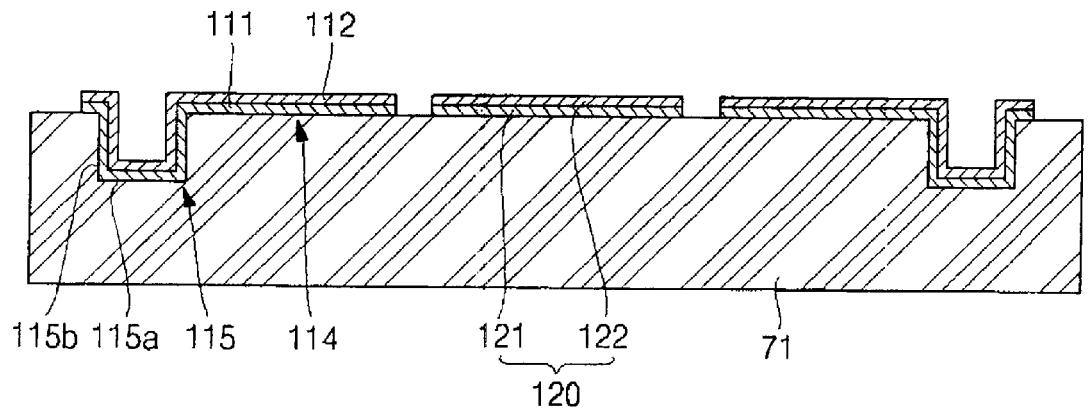

FIGS. 8A and 8B are sectional views illustrating another method of manufacturing a semiconductor package according to an embodiment of the present invention. The step in FIG. 8A is performed after the step shown in FIG. 7B. That is, after the step in FIG. 7B, the first metal layer 111 of the electrically conductive pattern and the first metal layer 121 of the metal pad layers 120 are formed on the metal carrier 71. The first metal layer 111 of the electrically conductive pattern and the first metal layer 121 of the metal layers can be formed by plating. That is, this step can be performed by partially performing the plating of metal.

Referring FIG. 8B, the second metal layer 112 of the electrically conductive pattern 110 and the second metal layer 122 of the metal pad layers 120 are formed on the metal carrier 71. Likewise, the step of FIG. 8B can be performed by partially performing the plating of metal.

After the above step, the method goes back to the steps shown in FIGS. 7F-7L. By doing the above steps shown in FIGS. 8A-8B, the semiconductor package 100 according to the embodiment of the present invention can be formed by plating without a process of etching metal.

Hereinafter, a method of manufacturing a semiconductor package 300 according to still another embodiment of the present invention will be described. FIGS. 9A to 9L are sectional views illustrating the method of manufacturing the semiconductor package 300. Since the method disclosed in FIGS. 9A to 9L are similar to that shown in FIGS. 7A to 7L, the description of a difference there between will be concentrated hereinafter.

Figure 9A:
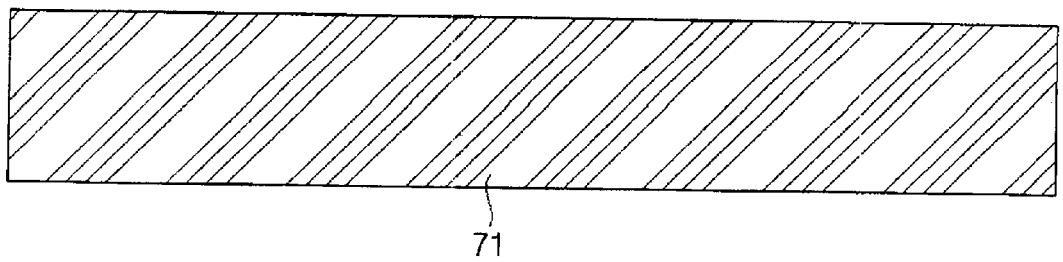
FIGS. 9A to 9L are sectional views illustrating a method of manufacturing a semiconductor package according to still another embodiment of the present invention.

As illustrated in FIG. 9A, in order to manufacture the semiconductor package 300 according to still another embodiment of the present invention, firstly a metal carrier 71 is provided. The metal carrier 71 is identical to the metal carrier 71 in FIG. 7A.

Figure 9B:
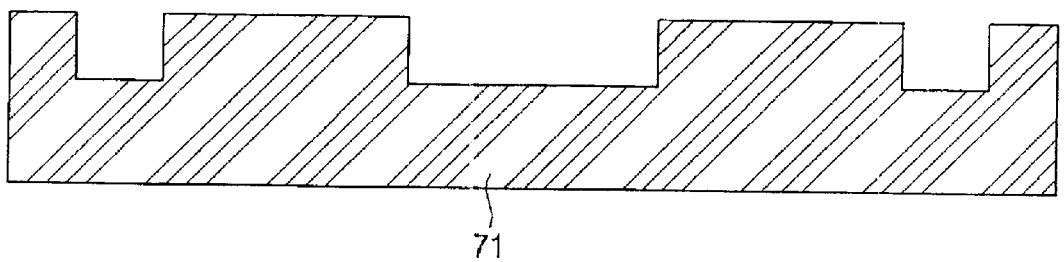

As illustrated in FIG. 9B, the metal carrier 71 is formed with a pattern. The pattern of the metal carrier 71 is formed in correspondence with a region where the first metal layer 111, the second metal layer 112, and the metal pad layers 320 will be formed. That is, in the metal carrier, a well shape with a predetermined depth is formed in the region where the first metal layer 111, the second metal layer 112, and the metal pad layers 320 will be formed.

Figure 9C:
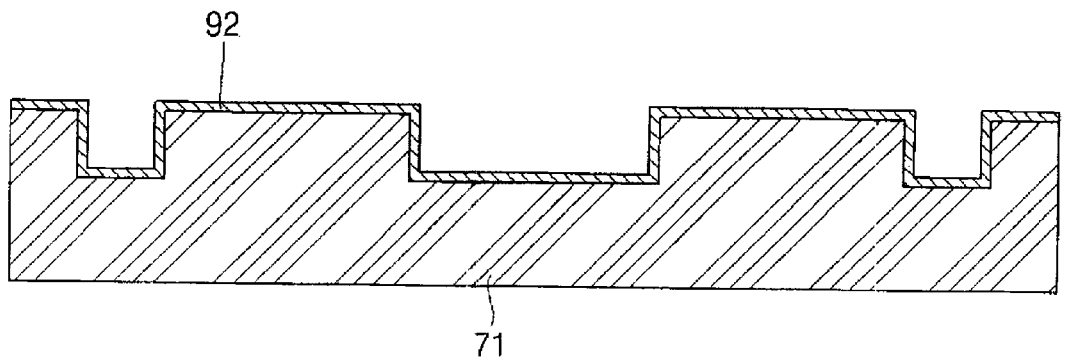
Figure 9D:
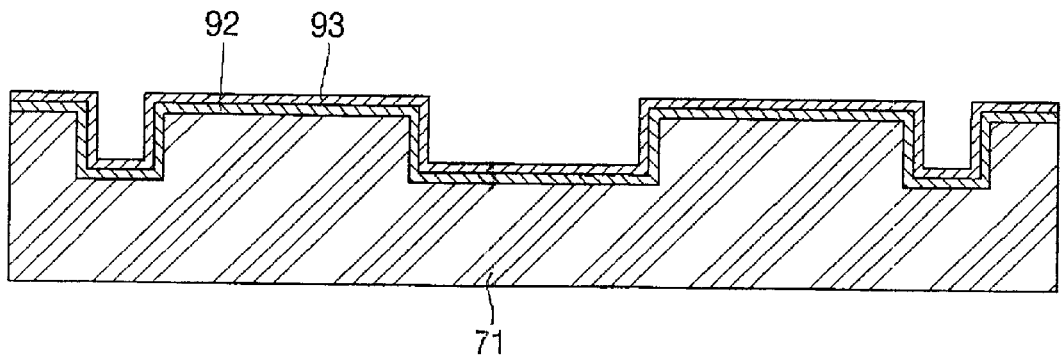

As illustrated in FIGS. 9C and 9D, a lower metal layer 92 and an upper metal layer 93 are formed. The metal layers are formed to cover the upper side of the metal carrier 71. In other words, the metal layers are formed in correspondence with the pattern of the metal carrier 71. The process of forming the metal layers is identical to the process in FIGS. 7C and 7D except for the shapes of the metal layers.

Figure 9E:
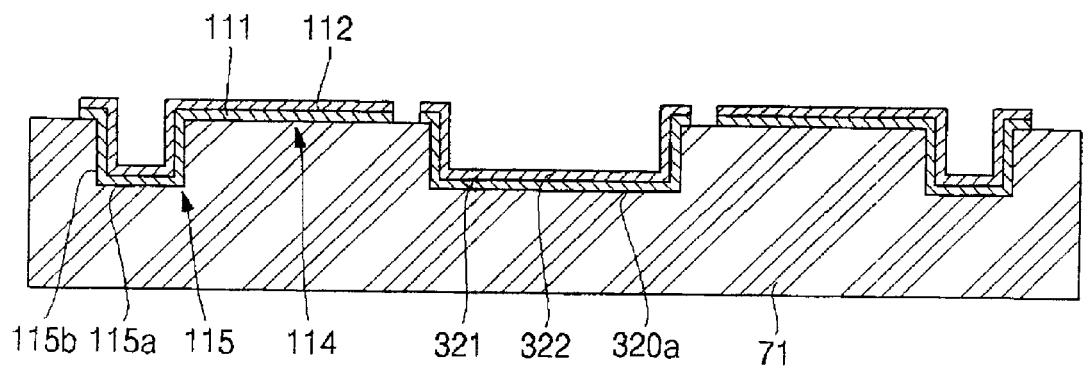

As illustrated in FIG. 9E, the metal layers are then patterned. The metal layers may be patterned by photolithography. The patterns of the metal layers are formed by separating the metal pad layers 320 from the first metal layer 111 and the second metal layer 112 of the electrically conductive pattern 110. Except for the shape of the metal pad layers 320, the patterning process of the metal layers are identical to the process in FIG. 7E.

Figure 9F:
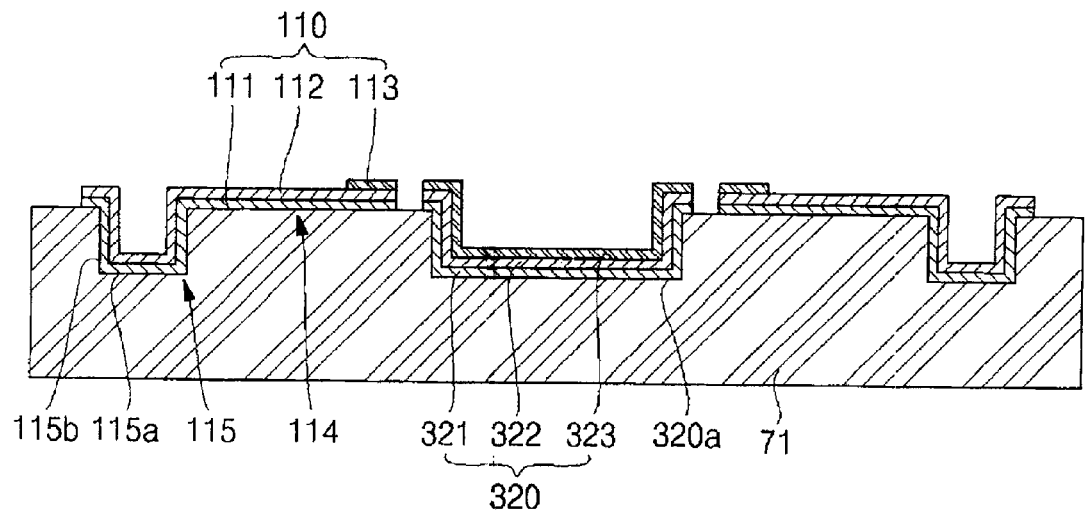

As illustrated in FIG. 9F, a third metal layer 113 is formed on the second metal layer 112 of the electrically conductive pattern 110. In addition, a third metal layer 323 can be formed on the second metal layer 322 of the metal pad layers 320 using the same process. The process of forming the metal layers 113 and 323 can be selectively omitted. Moreover, the process of forming the metal layers 113 and 323 is identical to the process in FIG. 7F.

Figure 9G:
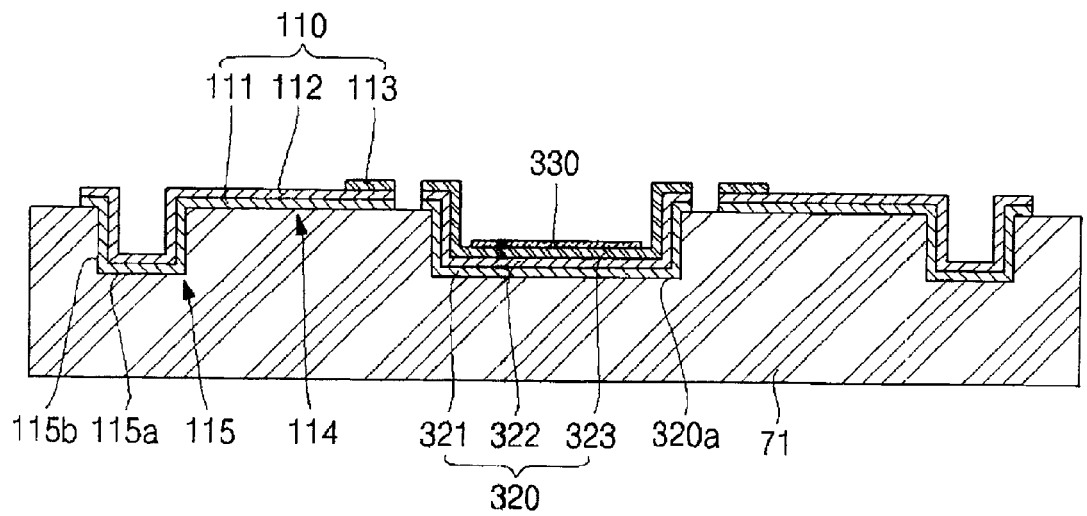

As illustrated in FIG. 9G, next an adhesive 330 is adhered on the metal pad layers 320. That is, the metal pad layers 320 are formed in the well and the adhesive 330 is adhered in the well. The process of bonding the adhesive 330 is identical to the process in FIG. 7G except for the position of the adhesive 330.

Figure 9H:
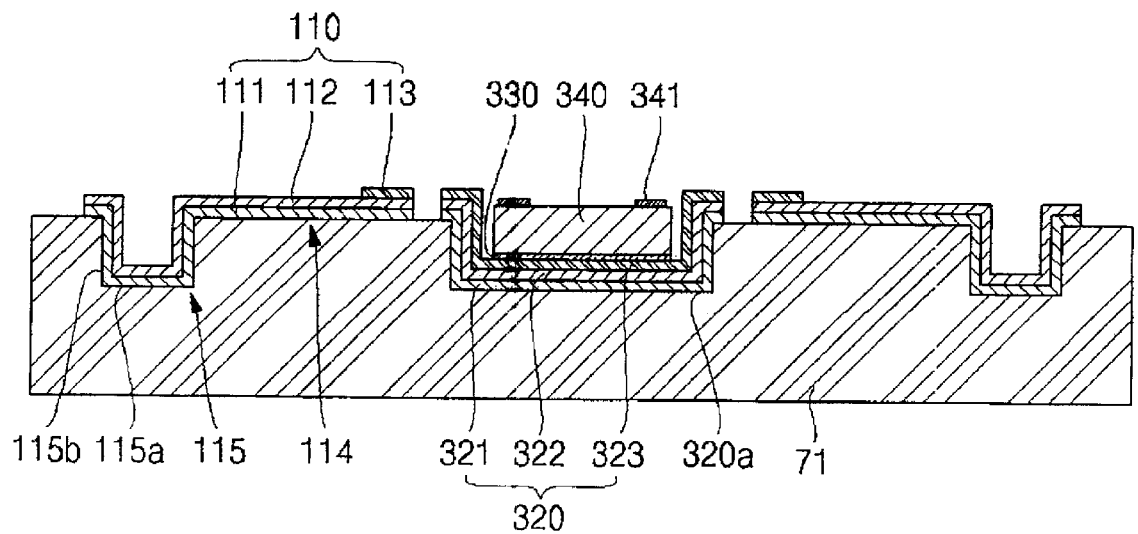

As illustrated in FIG. 9H, after that, the semiconductor die 340 is to the adhesive 330 and then adhered to the metal pad layers 320. The semiconductor die 340 is put into the well formed by the metal pad layers 320 to be adhered thereto. The process of bonding the semiconductor die 340 is identical to the process in FIG. 7H except for the location of the semiconductor die 340.

Figure 9I:
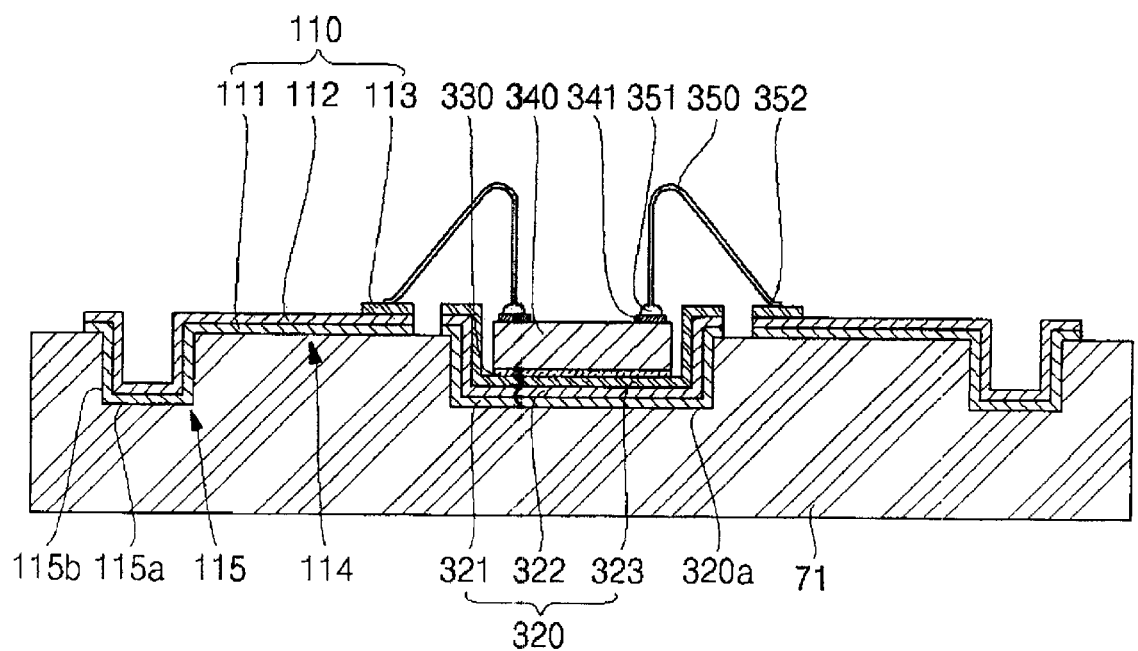

As illustrated in FIG. 9I, next, a wire bonding is performed. The electrically conductive wire 350 electrically couples the third metal layer 113 of the electrically conductive pattern 110 to the bond pad 341 of the semiconductor die 340. Alternatively, the electrically conductive wire 350 can selectively couple the second metal layer 112 of the electrically conductive pattern 110 to the bond pad 341 of the semiconductor die 340 if the second metal layer 112 is the metal layer to be wire bonded.

Since the semiconductor die 340 is inserted into the well formed by the metal pad layers 320, a height of the bond pad 341 may be similar to the height of the third metal layer 113. Therefore, as described above, the loop height of the electrically conductive wire 350 can be lowered, and the length of the electrically conductive wire 350 bonded can be shortened. The process of the wire bonding is identical to the process in FIG. 7I except for the loop height and the length of the electrically conductive wire 350.

Figure 9J:
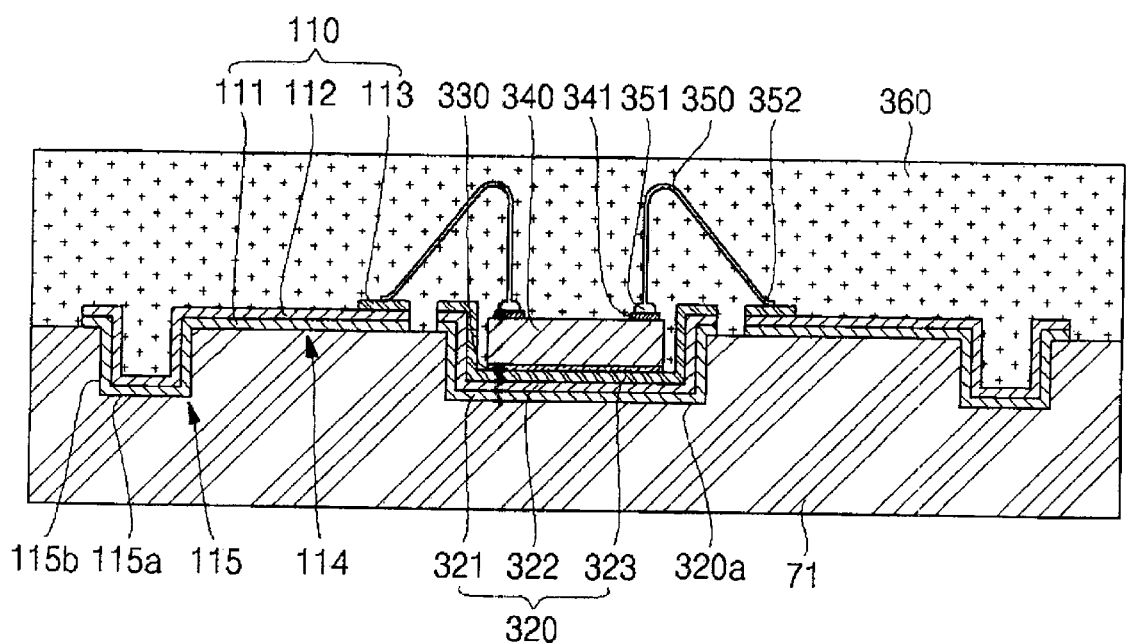

As illustrated in FIG. 9J, next, an encapsulation is performed. An encapsulant 360 encapulates the semiconductor die 340 and the electrically conductive wires 350 while enclosing the same. The process of the encapsulation is identical to the process in FIG. 7J except for the positions and the shapes of the semiconductor die 340 and the electrically conductive wire 350.

Figure 9K:
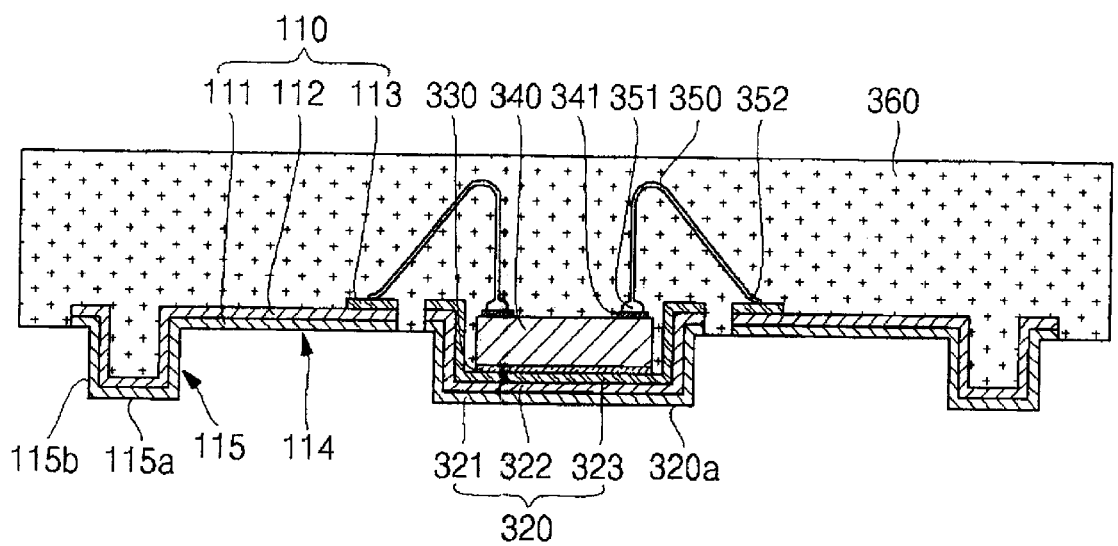

As illustrated in FIG. 9K, a process of removing the metal carrier 71 is performed. The process of removing the metal carrier 71 is performed by etching. The process of removing the metal carrier 71 is identical to the process in FIG. 7K.

Figure 9L:
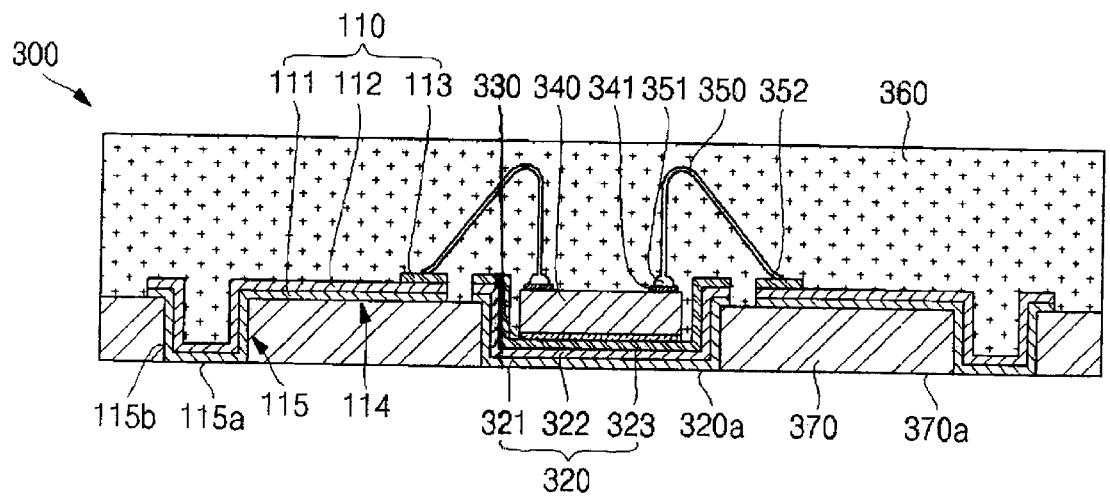

As illustrated in FIG. 9L, a process of forming an insulative layer 370 is performed. The insulative layer 370 is formed while filling a space defined by the electrically conductive pattern 110, the metal pad layers 320 and the encapsulant 360. The insulative layer 370 may be one of an epoxy molding compound (EMC), epoxy, polyer, polyimide (PI), benso cyclo butene (BCB), poly benx oxazol (PBO), phenolic resin, or an equivalent of the above materials and may be formed by molding, printing, and spraying. In addition, although not depicted, identically to FIG. 7L, the buffing, the electroless gold plating after the buffing, and the OSP may be further performed.

By doing the above, the semiconductor package 300 can be manufactured. Moreover, in the semiconductor package 300, as described above, routing is enabled, the signal noise can be reduced by decreasing the length of the electrically conductive wire, and processing time can be reduced by doing the normal wire bonding. Alternatively, since the entire height of the semiconductor package can be lowered, the semiconductor package 300 is suitable for a small size and the heat dissipation of the semiconductor die 340 can be easily performed as described above.

Figure 10A:
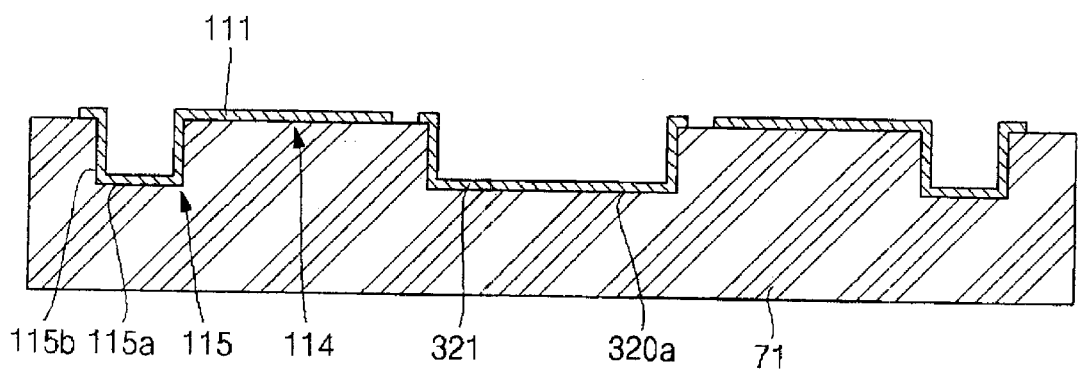
FIGS. 10A and 10B are sectional views illustrating another method of manufacturing a semiconductor package according to still another embodiment of the present invention.
Figure 10B:
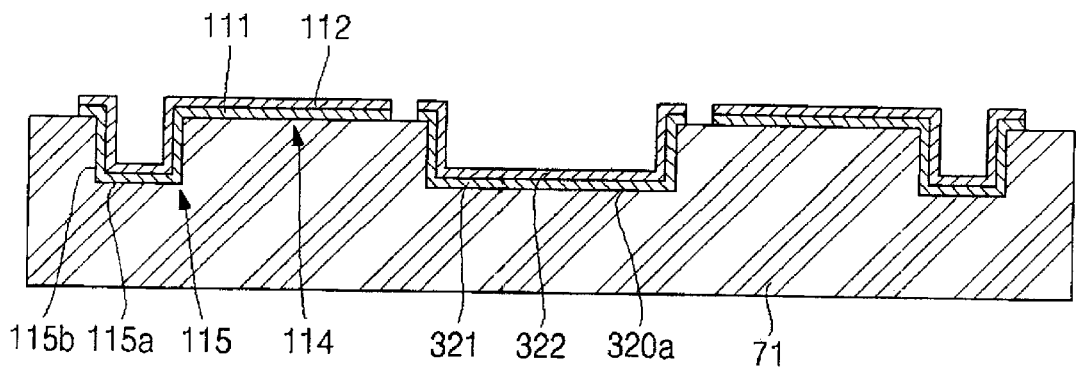

FIGS. 10A and 10B are sectional views illustrating another method of manufacturing a semiconductor package according to still another embodiment of the present invention. Referring to FIG. 10A, a first metal layer 111 and a first metal layer 321 are formed on the metal carrier 71. The first metal layers 111 and 121 can be formed by partially plating.

Referring to FIG. 10B, a second metal layer 112 of the electrically conductive pattern and a second metal layer 322 of the lower layer of die are formed. The second metal layers 112 and 322 are formed on the first metal layers 111 and 321.

After the above step, the step in FIG. 9F is further performed. By doing so, the semiconductor package 300 according to another embodiment of the present invention can be formed by plating.

FIGS. 11A to 11H are sectional views illustrating the method of manufacturing the semiconductor package 600 according to still another embodiment of the present invention.

Figure 11A:
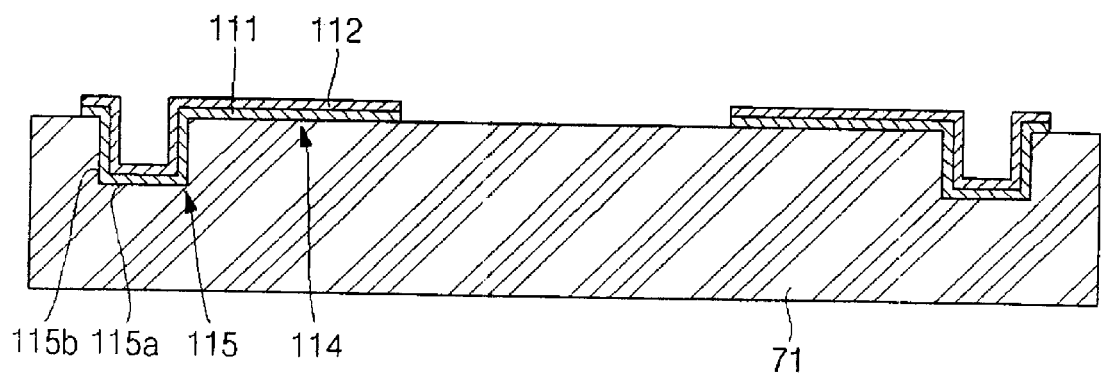
FIGS. 11A to 11H are sectional views illustrating a method of manufacturing a semiconductor package according to still another embodiment of the present invention.

Referring to FIG. 11A, the first metal layer 111 and the second metal layer 112 of the electrically conductive pattern 110 are formed on the half-etched metal carrier 71. Referring to FIGS. 7A to 7D, the first metal layer 111 and the second metal layer 112 may be formed by forming and etching a lower metal layer 72 and an upper metal layer 73 on the half-etched metal carrier 71. The above process is identical to the process in FIG. 7E except for the metal pad layers 120 are not formed on the metal carrier 71.

Figure 11B:
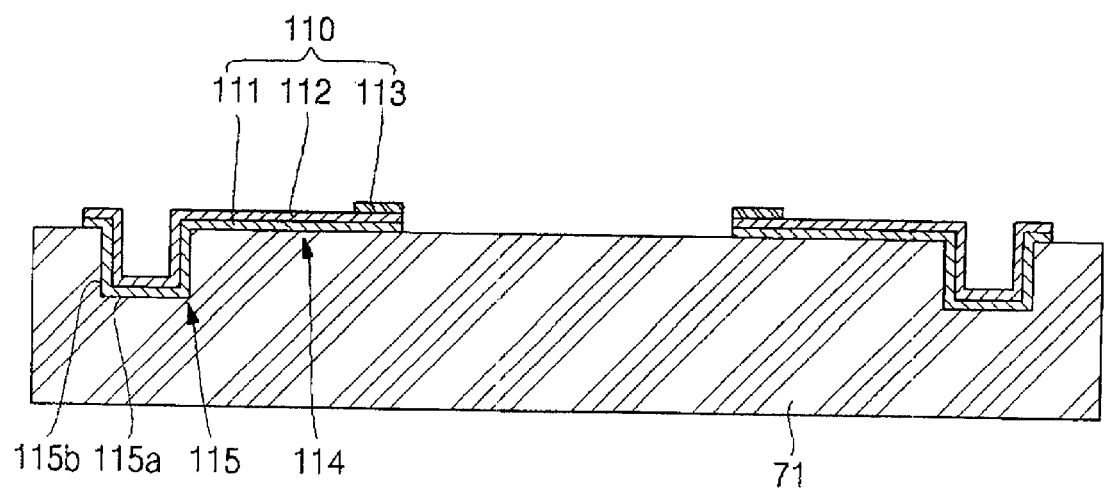

Referring FIG. 11B, next, a third metal layer 113 of the electrically conductive pattern 110 is formed. As described above, the third metal layer 113 may be selectively provided. The above process is identical to the process in FIG. 7F.

Figure 11C:
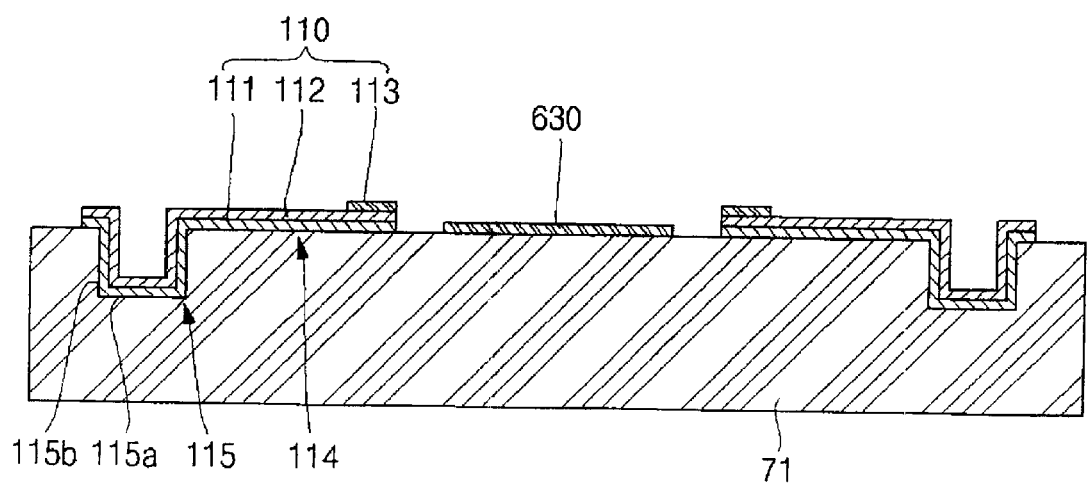

Referring FIG. 11C, after that, an adhesive 630 is directly formed on the metal carrier 71. The adhesive 630 may be a film or a paste. This process is identical to the step of forming the adhesive 130 in FIG. 7G except for the above-mentioned adhesive 630.

Figure 11D:
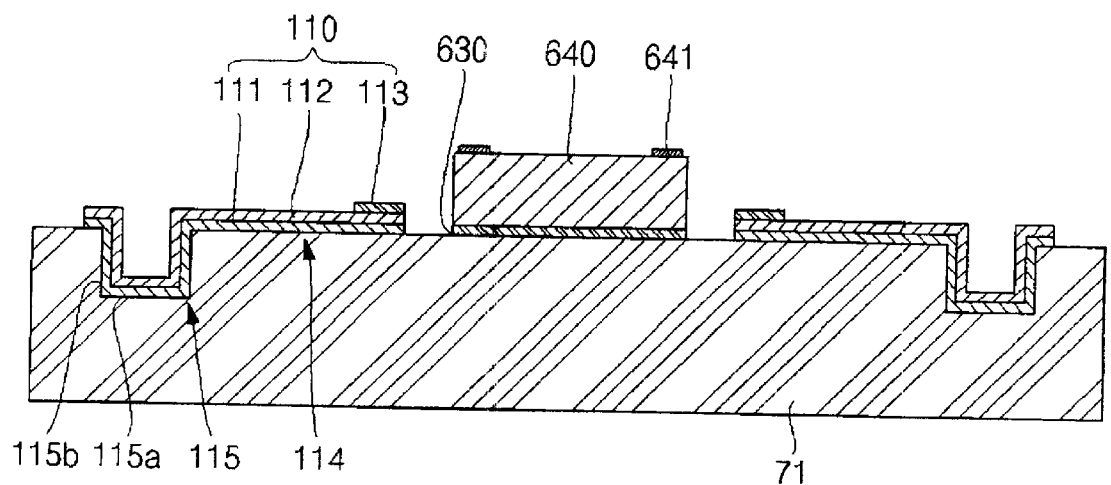

Referring FIG. 11D, next, a semiconductor die 640 is adhered on the adhesive 630. The above step is identical to the step of bonding the semiconductor die 130 in FIG. 7H.

Figure 11E:
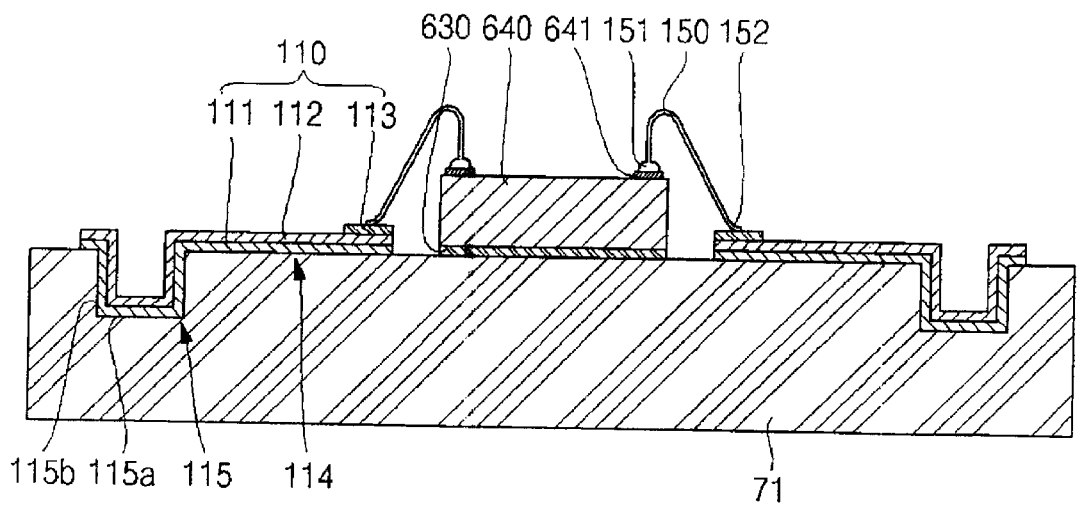

Referring to FIG. 11E, the electrically conductive wire 150 electrically couples a bond pad 641 of the semiconductor die 640 to the third metal layer 113 of the electrically conductive pattern 110. In addition, as described above, in a case when the third metal layer 113 is not provided, the electrically conductive wire 150 may electrically couple the second metal layer 112 to the bond pad 641. The above step is identical to the wire bonding step in FIG. 7I.

Figure 11F:
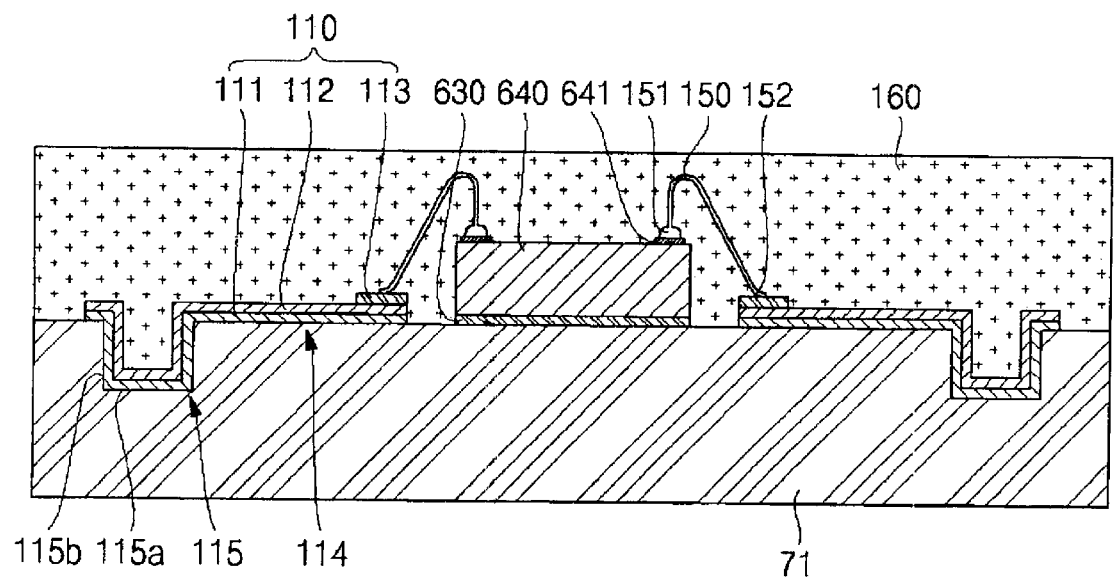

Referring to FIG. 11F, next, the encapsulant 160 encapsulates the semiconductor die 640 and the electrically conductive wire 150 while enclosing the same. The above step is identical to the encapsulation in FIG. 7J.

Figure 11G:
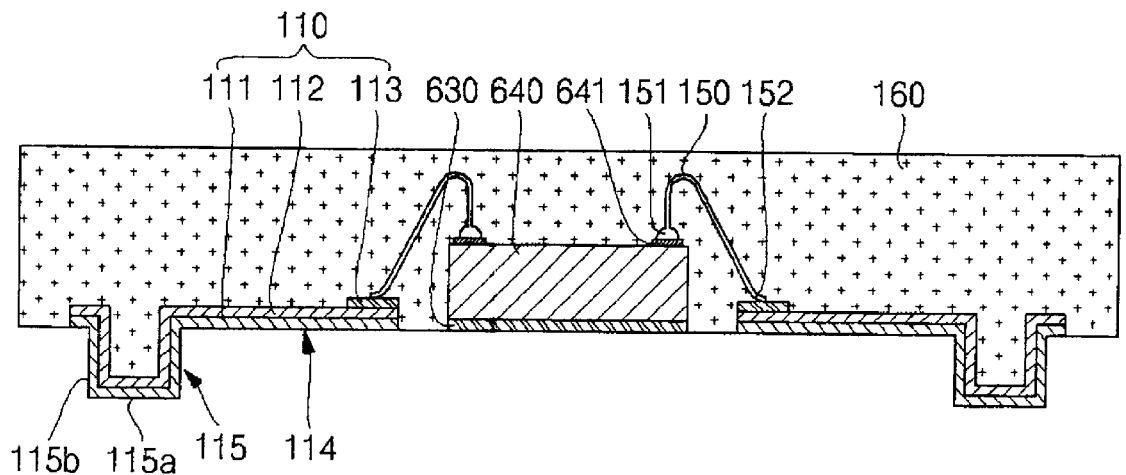

Referring to FIG. 11G, next, a step of removing the metal carrier 71 is performed. The step of removing the metal carrier 71 may be performed by etching. The step is identical to the step in FIG. 7K.

Figure 11H:
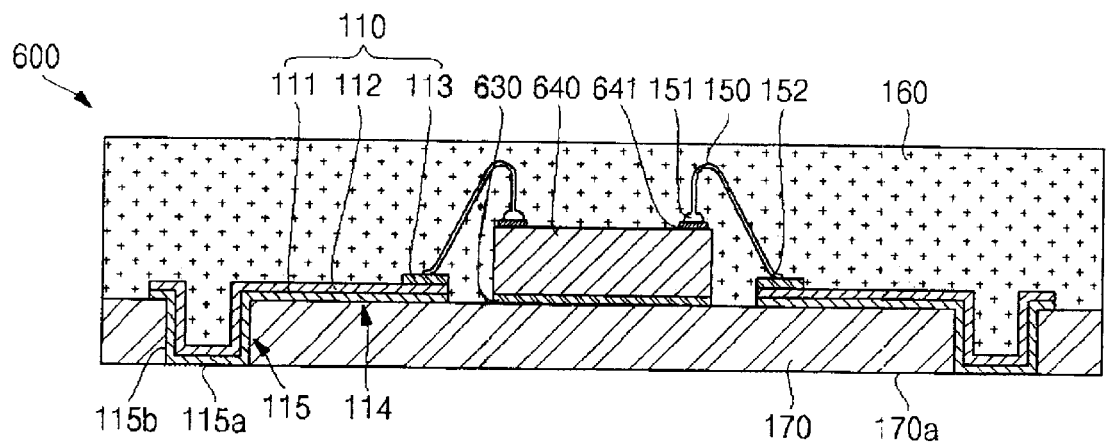

Referring to FIG. 11H, after that, a step of forming the insulative layer 170 is performed. The step is identical to the step in FIG. 7L.

By doing the above, the semiconductor package 600 can be manufactured. As described above, in the semiconductor package 600, since the lower layer of die is not provided in the lower side of the semiconductor die 640, the size of the package can be reduced and material cost can be reduced.

Figure 12A:
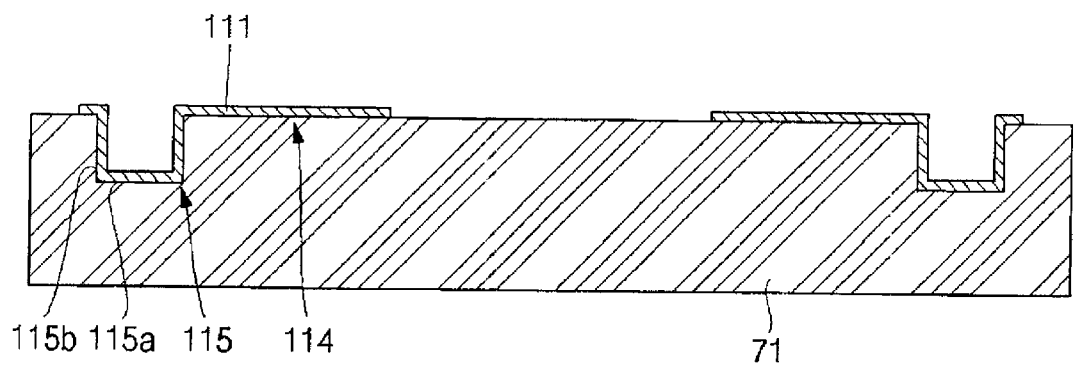
FIGS. 12A and 12B are sectional views illustrating another method of manufacturing a semiconductor package according to still another embodiment of the present invention.
Figure 12B:
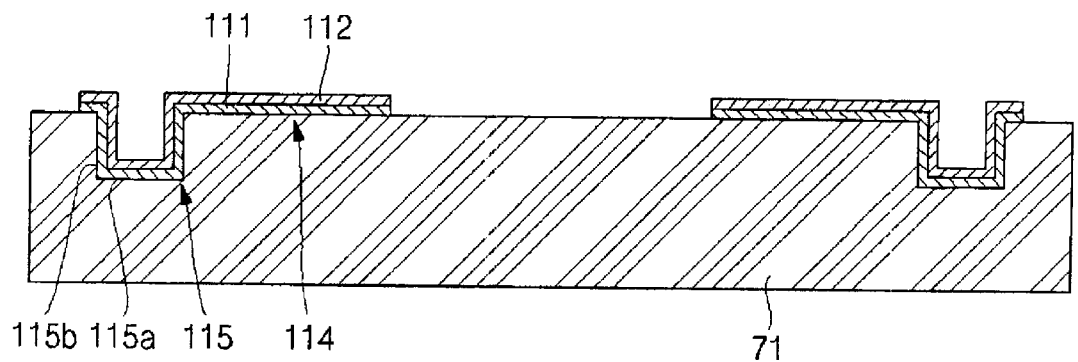

FIGS. 12A and 12B are sectional views illustrating another method of manufacturing the semiconductor package 600 according to still another embodiment of the present invention.

Referring to FIG. 12A, the first metal layer 111 of the electrically conductive pattern 110 is formed on the half-etched metal carrier 71. The first metal layer 111 can be formed by plating partially.

Referring to FIG. 12B, after that, the second metal layer 112 of the electrically conductive pattern 110 is formed. The second metal layer 112 may be formed on the first metal layer 111. After that, the steps in FIGS. 11B to 11H can be further performed.

By doing so, the semiconductor package 600 according to still another embodiment of the present invention can be formed by plating.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
   an insulative layer having at least one channel formed on a first surface of the insulative layer;
   a conductive pattern conforming to the at least one channel and exposed to a bottom surface of the semiconductor package;
   a metal pad formed on the first surface of the insulative layer and electrically isolated from the conductive pattern, wherein the metal pad comprises a plurality of metal layers;
   a semiconductor die coupled to a top surface of the metal pad and electrically connected to the conductive pattern; and
   an encapsulant at least partially filling the at least one channel.

2. The semiconductor package according to claim 1, wherein the conductive pattern exposed on the bottom surface of the semiconductor package is approximately coplanar with a second surface of the insulative layer.

3. The semiconductor package according to claim 1, wherein the conductive pattern comprises:
   a first section formed on the first surface of the insulative layer; and
   a second section coupled to the first section and formed in the at least one channel.

4. The semiconductor package according to claim 3, wherein the second section comprises:
   a side surface coupled to the first section formed on the insulative layer; and
   a bottom surface coupled to the side surface, the bottom surface approximately planer with a second surface of the insulative layer and exposed.

5. The semiconductor package according to claim 1, wherein the electrically conductive pattern comprises:
   a first metal layer formed on the first surface of the insulative layer and conforming to the at least one channel; and
   a second metal layer formed on the first metal layer.

6. The semiconductor package according to claim 5, wherein the electrically conductive pattern further comprises a third metal layer formed on sections of the second metal layer.

7. The semiconductor package according to claim 1, further comprising an adhesive layer formed on a top surface of the metal pad, the semiconductor die attached to the adhesive layer.

8. The semiconductor package according to claim 1, wherein the metal pad is approximately planar with the conductive pattern.

9. The semiconductor package according to claim 1, wherein the metal pad comprises:
   a first metal pad layer formed on the insulative layer; and
   a second metal pad layer formed on the first metal pad layer.

10. The semiconductor package according to claim 1, further comprising at least one solder ball coupled to the conductive pattern exposed on the bottom surface of the semiconductor package.

11. The semiconductor package according to claim 1, wherein the insulative layer further has a well formed in the first surface of the insulative layer, the metal pad positioned in the well.

12. The semiconductor package according to claim 11, wherein a second surface of the insulative layer, the conductive pattern exposed on the bottom surface of the semiconductor package, and a bottom surface of a metal pad formed in the well are approximately planar.

13. A semiconductor package comprising:
   an insulative layer having at least one channel formed on a first surface of the insulative layer;
   a conductive pattern formed on a substantially horizonal surface of the insulative layer and a substantially vertical surface of the at least one channel and exposed to a bottom surface of the semiconductor package;
   a metal pad formed on the first surface of the insulative layer and electrically isolated from the conductive pattern, wherein the metal pad comprises a plurality of metal layers;
   a semiconductor die positioned on a top surface of the metal pad and electrically connected to the conductive patterns; and
   an encapsulant at least partially filling the at least one channel.

14. The semiconductor package according to claim 13, further comprising:
   a well formed in the first surface of the insulative layer; and
   wherein the metal pad is formed on the insulative layer and in the well, the semiconductor die attached to the metal pad.

15. The semiconductor package according to claim 14, wherein a second surface of the insulative layer, the conductive pattern exposed to the bottom surface of the semiconductor package, and a bottom surface of the metal pad in the well are approximately planar.

16. A method of manufacturing a semiconductor package comprising:
   forming at least one channel in a first surface of a metal carrier;
   forming a conductive pattern which conforms to the at least one channel and exposed to a bottom surface of the semiconductor;
   forming a metal pad on the first surface of the insulative layer and electrically isolated from the conductive pattern, wherein the metal pad comprises a plurality of metal layers;
   attaching a semiconductor die to the metal pad;
   electrically attaching the semiconductor die to the conductive patterns;
   encapsulating the semiconductor die, an encapsulant partially filling the at least one channel;
   removing the metal carrier; and
   forming an insulative layer on a bottom surface of the conductive pattern wherein a portion of the bottom surface of the conductive pattern is exposed.

17. The method of claim 16 wherein forming conductive pattern comprises:
   forming a plurality of metal layers on the first surface of the metal carrier, the plurality of metal layers conforming to the at least one channel; and
   patterning the plurality of metal layers to form the conductive pattern.

18. The method of claim 16, further comprising:
   forming a well in the metal carrier; and
   wherein the metal pad is formed in the well, the metal pad electrically isolated from the conductive pattern.

19. The method of claim 18, further comprising attaching the semiconductor die to the metal pad in the well.

20. The method of claim 17, further comprising attaching solder balls to the conductive pattern exposed to a bottom surface of the semiconductor package.

* * * * *